(12) United States Patent
Shibata

(10) Patent No.: US 7,977,653 B2
(45) Date of Patent: Jul. 12, 2011

(54) SEMICONDUCTOR DEVICE FABRICATION METHOD AND FABRICATION APPARATUS USING A STENCIL MASK

(75) Inventor: Takeshi Shibata, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 233 days.

(21) Appl. No.: 12/320,830

(22) Filed: Feb. 5, 2009

(65) Prior Publication Data

US 2009/0158236 A1    Jun. 18, 2009

Related U.S. Application Data

(63) Continuation of application No. 10/969,181, filed on Oct. 21, 2004, now Pat. No. 7,501,214.

(30) Foreign Application Priority Data

Oct. 21, 2003    (JP) ................ P2003-361142

(51) Int. Cl.
    *H01J 37/304*    (2006.01)
(52) U.S. Cl. ............... 250/492.22; 250/492.23
(58) Field of Classification Search ............... 430/5, 22, 430/394; 250/492.2, 492.22; 355/53, 72
    See application file for complete search history.

(56) References Cited

U.S. PATENT DOCUMENTS

| 4,825,086 | A | 4/1989 | Mueller | |
| 6,287,876 | B1 * | 9/2001 | Fujiwara | ............ 438/4 |
| 6,770,402 | B2 | 8/2004 | Suguro et al. | |
| 6,800,863 | B2 * | 10/2004 | Jun et al. | ......... 250/492.21 |
| 6,875,544 | B1 | 4/2005 | Sweatt et al. | |
| 2003/0057381 | A1 | 3/2003 | Hirayanagi | |

FOREIGN PATENT DOCUMENTS

| JP | 58-106822 | 6/1983 |
| JP | 5-53116 | 7/1993 |
| JP | 7-312193 | 11/1995 |
| JP | 8-22965 | 1/1996 |
| JP | 2000-3881 | 1/2000 |
| JP | 2002-203806 | 7/2002 |
| JP | 2004-192860 | 7/2004 |
| TW | 324795 | 1/1998 |
| WO | WO 01/06549 A1 | 1/2001 |

OTHER PUBLICATIONS

Notice of Grounds for Rejection issued by the Japanese Patent Office on Sep. 25, 2007, for Japanese Patent Application No. 2003-361142, and English-language translation thereof.

Notice of Rejection issued by the Taiwanese Intellectual Property Office dated Nov. 18, 2005, for Taiwanese Patent Application No. 09-3132014, and English-language translation thereof.

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

A semiconductor device fabrication method includes preparing a substrate having a first circuit pattern of a semiconductor device; providing a mask with at least part of second circuit pattern of the semiconductor device; collimating incident direction of particles; changing at least one of the a substrate angle between a vertical axis of the substrate and the incident direction of the particles and a mask angle between a vertical axis of the mask and the incident direction so that the second circuit pattern on the mask can be aligned to the first circuit pattern on the substrate with a design margin; and selectively irradiating the particles to the substrate using the mask.

3 Claims, 22 Drawing Sheets

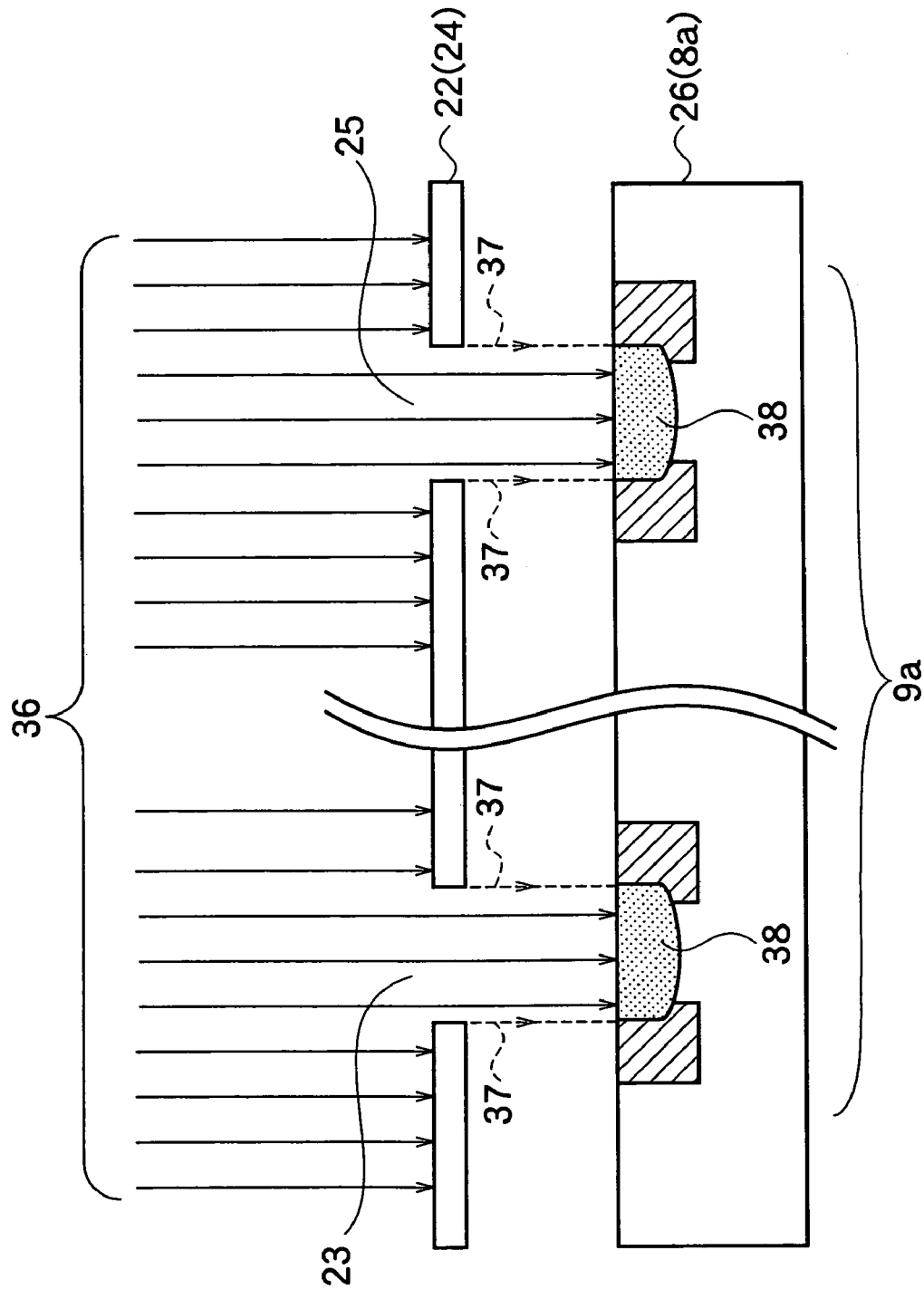

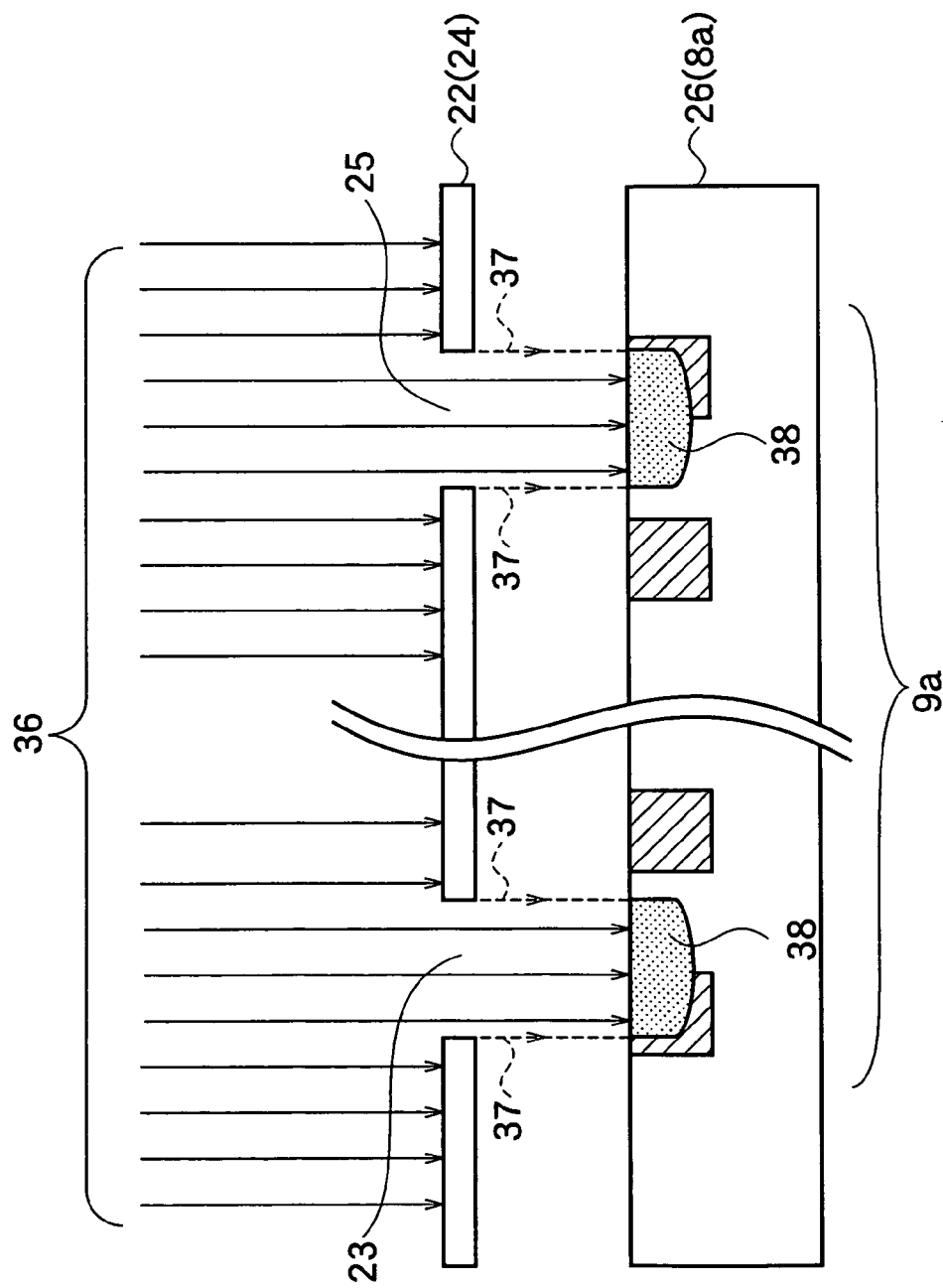

SEMICONDUCTOR DEVICE FABRICATION METHOD AND FABRICATION APPARATUS USING A STENCIL MASK

CROSS REFERENCE TO RELATED APPLICATIONS

This is a continuation of application Ser. No. 10/969,181, filed Oct. 21, 2004 now U.S. Pat. No. 7,501,214, which is incorporated herein by reference.

This application is based upon and claims the benefit of priority from prior Japanese Patent Applications No. P2003-361142, filed on Oct. 21, 2003; the entire contents of which are incorporated herein by reference.

BACKGROUND OF THE INVENTION

1. Field of the Invention

The present invention relates to a semiconductor device fabrication method and an apparatus that applies particles to selected areas of a substrate to be processed using a stencil mask.

2. Description of the Related Art

According to a semiconductor device fabrication method using a stencil mask, an entire circuit pattern of a semiconductor device or part thereof is formed on a stencil mask as a pattern of through-holes. Next, particles are irradiated onto selected areas in a substrate to be processed via circuit pattern through-holes formed on the mask, dealing a circuit pattern on the substrate to be processed.

According to some semiconductor device fabrication methods using the stencil mask, the size of the circuit pattern formed on a mask may be equal to that of a circuit pattern formed on a substrate to be processed. For example, those methods include ion implantation using a stencil mask, low energy electron beam proximity lithography, X-ray lithography or related methods. The particles include ions, electrons and photons.

According to these fabrication methods that allow formation of a circuit pattern on a substrate to be processed that equal in size to a circuit pattern formed on a stencil mask (hereafter, called a 'proximity projection process'), when there is a difference in size between a design size of a circuit pattern using a stencil mask and the actual circuit size of the circuit pattern formed on the stencil mask during a fabrication process, use of a stencil mask in processing a substrate to be processed always creates a misalignment.

In addition, the proximity projection process and a process using a photo mask, which is obtained by enlarging a circuit pattern so as to carry out image reduction exposure such as photolithography (hereafter, called an 'image reduction process'), may be used together for semiconductor device fabrication. Differences in reduction ratio from the photo mask for a circuit pattern to a substrate to be processed occurs during the image reduction process. The circuit pattern on a substrate to be processed is obtained by enlarging or reducing a designed circuit pattern. When subjecting the substrate to be processed to proximity projection, since a circuit pattern formed on the substrate to be processed is equal to a designed circuit pattern, misalignment occurs between the circuit pattern formed in the underlying layer of the substrate to be processed and an additionally formed circuit pattern.

Consideration of this misalignment as well as the size of a designed circuit pattern when designing a circuit may achieve a desired performance of a semiconductor device; however, the size of the semiconductor device is enlarged.

SUMMARY OF THE INVENTION

According to an aspect of the present invention, a semiconductor device fabrication method is provided. The method includes preparing a substrate having a first circuit pattern of a semiconductor device; providing a mask with at least part of second circuit pattern of the semiconductor device; collimating incident direction of particles; changing at least one of the a substrate angle between a vertical axis of the substrate and the incident direction of the particles and a mask angle between a vertical axis of the mask and the incident direction so that the second circuit pattern on the mask can be aligned to the first circuit pattern on the substrate with a design margin; and selectively irradiating the particles to the substrate using the mask.

According to another aspect of the present invention, a semiconductor device fabrication method is provided. The method includes preparing a substrate having a first circuit pattern of a semiconductor device, an on-substrate first mark, and an on-substrate second mark; providing a mask with at least part of second circuit pattern of the semiconductor device, an on-mask first mark, and an on-mask second mark; collimating incident direction of particles; changing at least one of a substrate angle between a vertical axis of the substrate and the incident direction of the particles and a mask angle between the vertical axis of the mask and the incident direction so that the on-mask first mark can be aligned to the on-substrate first mark with a design margin and that the on-mask second mark can be aligned to the on-substrate second mark with a design margin; and selectively irradiating the particles to the substrate using the mask.

According to still another aspect of the present invention, a semiconductor device fabrication method is provided. The method includes preparing a substrate having a first circuit pattern of a semiconductor devise, and at least three on-substrate marks; provide a mask with at least part of second circuit pattern of the semiconductor devices and at least three on-mask marks; collimating incident direction of particles; changing at least one of a substrate angle between a vertical axis of the substrate and the incident direction of particles and a mask angle between a vertical axis of the mask and the incident direction so that the second circuit pattern on the mask can be aligned to the first circuit pattern on the substrate with a design margin; and selectively irradiating the particles to the substrate using the mask.

According to still another aspect of the present invention, a semiconductor device fabrication apparatus is provided. The apparatus includes a particle direction collimation unit collimating incident direction of particles, and selectively irradiating the particles to a substrate having a first circuit pattern of a semiconductor device using a mask with at least part of second circuit pattern of the semiconductor device; and an angle adjustment unit changing at least one of a substrate angle between a vertical axis of the substrate and the incident direction of the particles and a mask angle between the vertical axis of the mask and the incident direction so that the second circuit pattern on the mask can be aligned to the first circuit pattern on the substrate with a design margin.

According to still another aspect of the present invention, a semiconductor device fabrication apparatus is provided. The apparatus includes a particle direction collimating unit collimating incident direction of particles, and selectively irradiating the particles to a substrate having a first circuit pattern of a semiconductor device, an on-substrate first mark, and an on-substrate second mark using a mask with at least part of second circuit pattern of the semiconductor device, an on-mask first mark, and an on-mask second mark; and an angle adjustment unit changing at least one of the substrate angle between the vertical axis of the substrate and the incident direction of the particles and the mask angle between the vertical axis of the mask and the incident direction so that the on-mask first mark can be aligned to the on-substrate first mark with a design margin and that the on-mask second mark can be aligned to the on-substrate second mark when viewed along the incident direction with a design margin.

BRIEF DESCRIPTION OF THE DRAWINGS

FIG. 8 is a cross section of a substrate to be processed and part of a mask circuit pattern area cut along a line VIII-VIII in FIG. 7 when selectively irradiating on the substrate to be processed using the semiconductor device fabrication method according to the embodiment;

FIG. 10 is a cross section of a mask and a substrate to be processed when selectively irradiating on the substrate to be processed irrelevant to the mask angle in the case of dimensional difference dx>0 in Example 1;

DETAILED DESCRIPTION OF THE INVENTION

Figure 1:
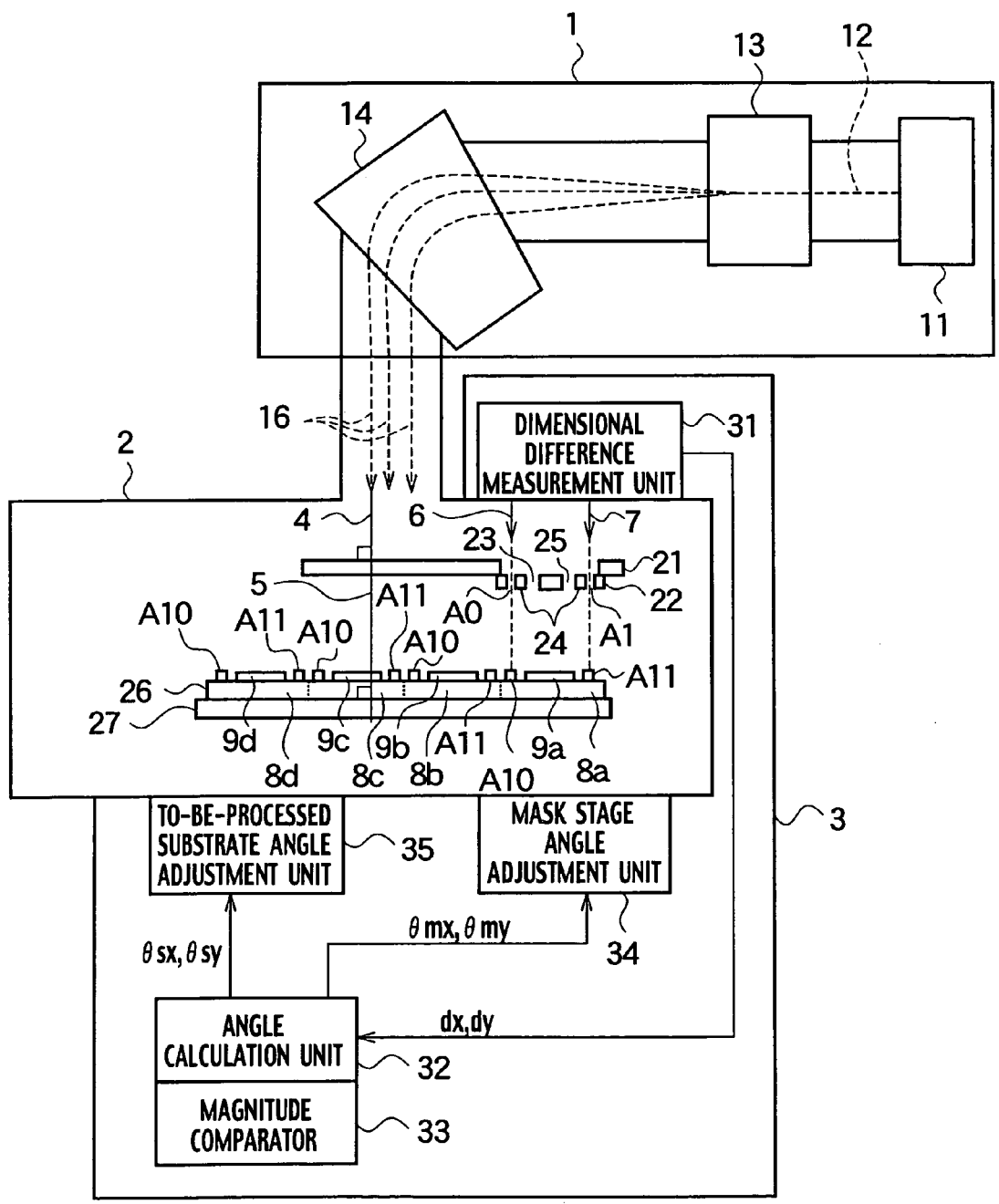
FIG. 1 shows a structure of a semiconductor device fabrication apparatus according to an embodiment.
Figure 2:
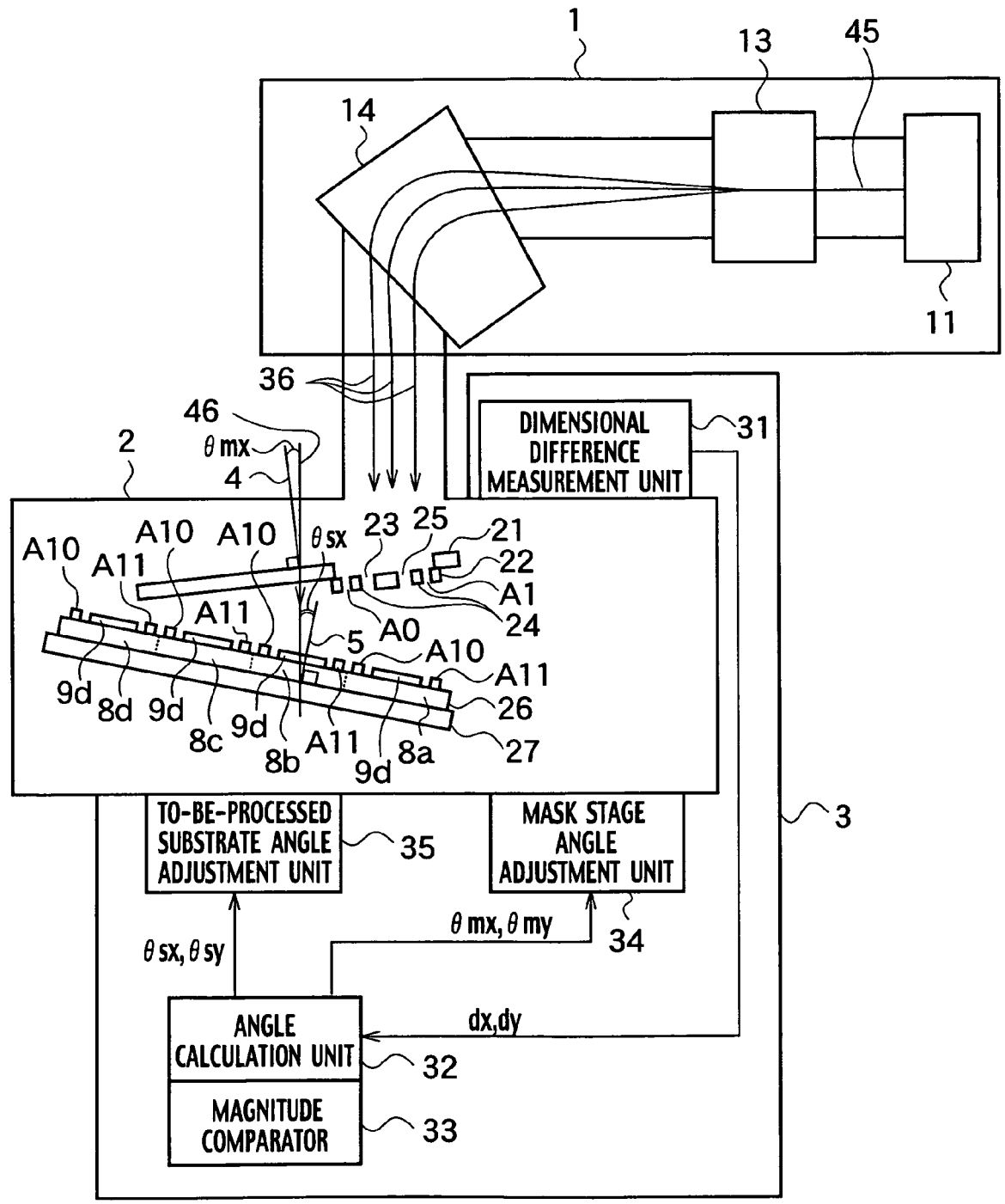
FIG. 2 shows a structure of a semiconductor device fabrication apparatus taking the mask angle and the substrate angle into account.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Semiconductor Device Fabrication Apparatus)

An example of a semiconductor device fabrication apparatus according to an embodiment of the present invention is shown in FIG. 1. A fabrication apparatus in which the present invention is applied to stencil ion implantation includes a particle direction collimating unit 1, an end station chamber 2, and an angle adjustment unit 3 as shown in FIG. 1.

The particle direction collimating unit 1 has a particle source 11, a scanner 13, and a magnet 14. The particle source 11 in a typical ion implantation system has an ion source, an accelerator or related units; however, these elements are omitted in FIG. 1 and are shown as just a particle source.

The end station chamber 2 has a mask stage 21, a mask 22, and a substrate stage 27. On the substrate stage 27 in the end station chamber 2, a substrate to be processed 26 can be provided. The mask 22 has a mask circuit pattern 24 configured with through-holes 23 and 25, and marks A0 (FIG. 4) and A1 on the mask. Note that marks A0 and A1 on the mask may be part of the mask circuit pattern 24. Marks A0 and A1 on the mask are not necessarily through-holes, and the shape, color, and material of marks A0 and A1 may be of any kind as long as the location of marks A0 and A1 on the mask can be measured. The substrate to be processed 26 may include the multiple semiconductor devices. The semiconductor devices 8a to 8d have respective circuit patterns 9a to 9d and marks A10 and A11 on the substrate. Note that marks A10 and A11 on the substrate may be part of the circuit patterns 9a to 9d. The shape, color, and material of marks A10 and A11 may be of any kind as long as the location of marks A10 and A11 can be measured.

The angle adjustment unit 3 has a dimensional difference measurement unit 31, an angle calculation unit 32, a magnitude comparator 33, a substrate to be processed angle adjustment unit 35, and a mask stage angle adjustment unit 34.

(Semiconductor Device Fabrication Method)

Figure 3:
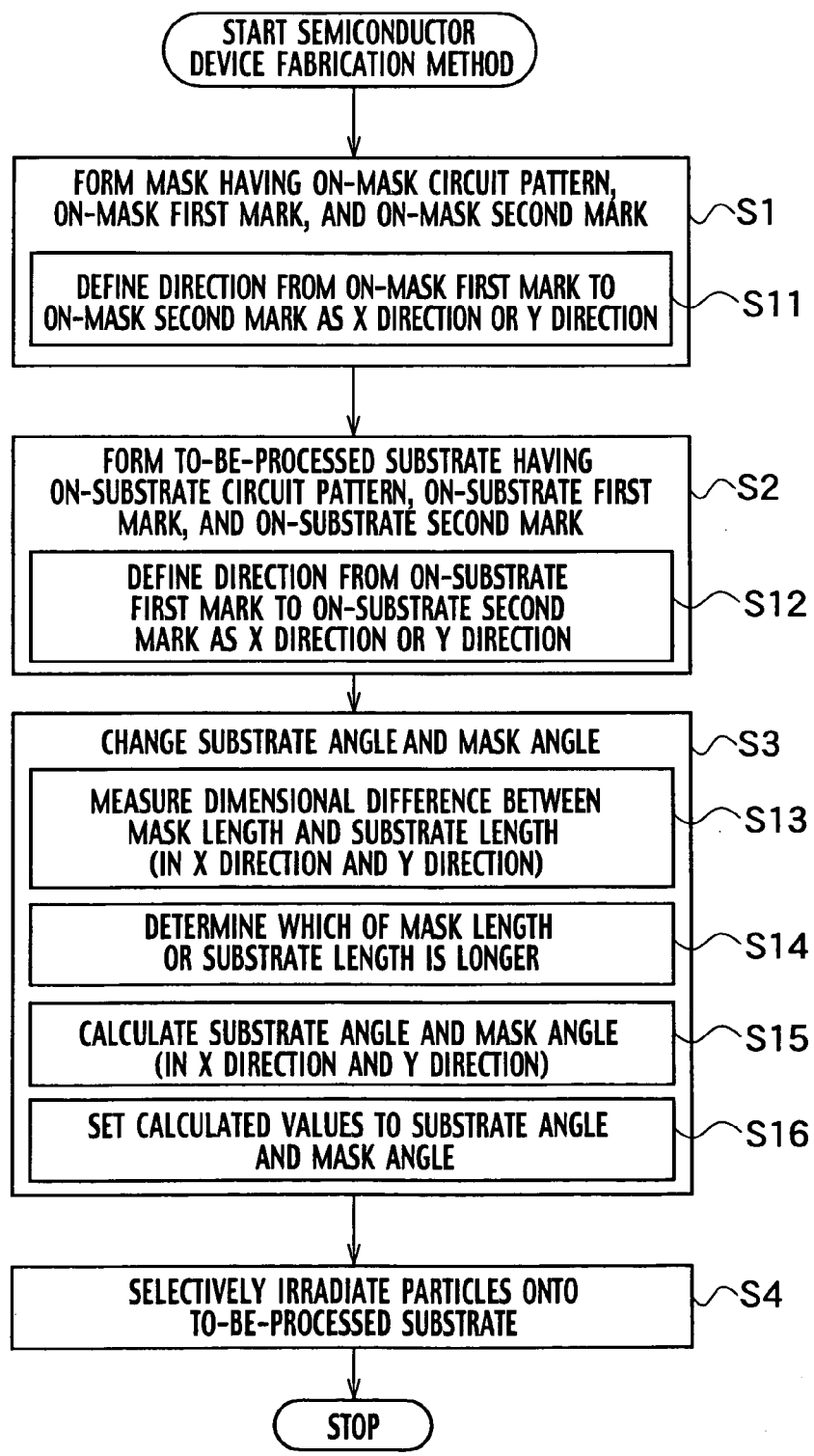
FIG. 3 is a flowchart describing a semiconductor device fabrication method according to the embodiment.

A semiconductor device fabrication method of an embodiment of the present invention is shown in FIG. 3. In step S1, a mask 22 is formed with marks A0-A3 thereupon, and a mask circuit pattern 24 congruent with one of multiple designed circuit patterns having an overlapping positional relationship among the semiconductor devices 8a to 8d as shown in FIGS. 1 and 4.

The mask circuit pattern 24 has through-holes 23 and 25. Both of the marks A0-A3 on the mask have through-holes. When the mask circuit pattern 24 overlaps the circuit patterns 9a to 9d on the substrate just before being subjected to a fabrication process, using the mask circuit pattern 24 with a certain designed overlapping positional relationship, the marks A0-A3 on the mask are deployed on the mask 22 so that the mark A0 on the mask can overlap a mark A10 on the substrate, the mark A1 on the mask can overlap a mark A11 on the substrate, the mark A2 on the mask can overlap a mark A12 on the substrate, and the mark A3 on the mask can overlap a mark A13 on the substrate in FIGS. 1 and 5.

Figure 4:
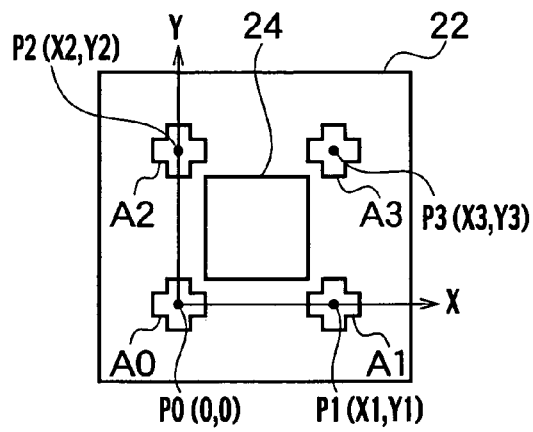
FIG. 4 is a top view of a mask used for the semiconductor device fabrication method according to the embodiment.

Note that in step S11, as shown in FIG. 4, the direction from the mark A0 to the mark A1 on the mask is defined as an X direction, and the direction from a mark A2 to a mark A3 on the mask is also defined as the X direction. The direction from the mark A0 to the mark A2 on the mask is defined as a Y direction, and the direction from the mark A1 to the mark A3 on the mask is also defined as the Y direction. With the X and the Y direction, an X-Y coordinate system is prepared on the mask 22. The origin of the X-Y coordinate system may be set as the center P0 (0, 0) of the mark A0 for convenience. Moreover, the center P1 (X1, Y1) of mark A1, center P2 (X2, Y2) of mark A2, and center P3 (X3, Y3) of mark A3 are set.

Next, in step S2, a substrate to be processed is prepared. The substrate to be processed is provided with the mark A10, the mark A11, and the circuit patterns 9a to 9d on there, which is not congruent with the mask circuit pattern 24, but is congruent with one of multiple designed circuit patterns for the semiconductor devices 8a to 8d having a designed overlapping positional relationship.

Figure 5:
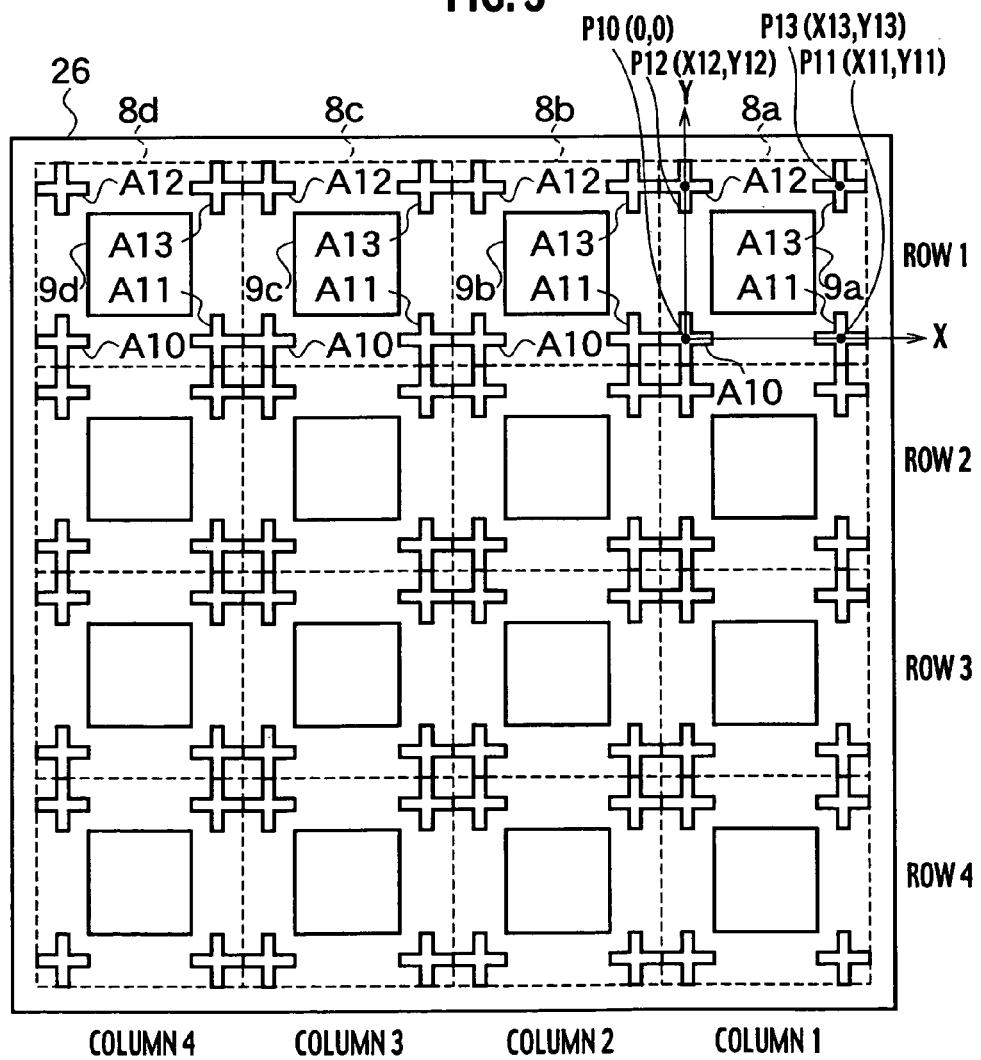
FIG. 5 is a top view of a substrate to be processed used for the semiconductor device fabrication method according to the embodiment.

Note that in step S12, the direction of the mark A10 to the mark A11 on the substrate is defined as a X direction, and direction of a mark A12 to a mark A13 on the substrate is defined as the X direction, as shown in FIG. 5. The direction from the mark A10 to the mark A12 on the substrate is defined as a Y direction, while the direction from the mark A11 to the mark A13 on the substrate is defined as the Y direction. With the X and the Y direction, the X-Y coordinate system is prepared on the substrate to be processed 26. The semiconductor devices 8a to 8d are formed on the substrate to be processed 26 along the rows 1 through 4 and also along the columns 1 through 4. This X-Y coordinate system is prepared for the semiconductor devices 8a to 8d. The origin of the X-Y coordinate system may be set as the center P10 (0, 0) of the mark A10 on the substrate for convenience. The center P11 (X11, Y11) of mark A11 on the substrate, and the center P12 (X12, Y12) of mark A12, and the center P13 (X13, Y13) of mark A13 are set.

Figure 6:
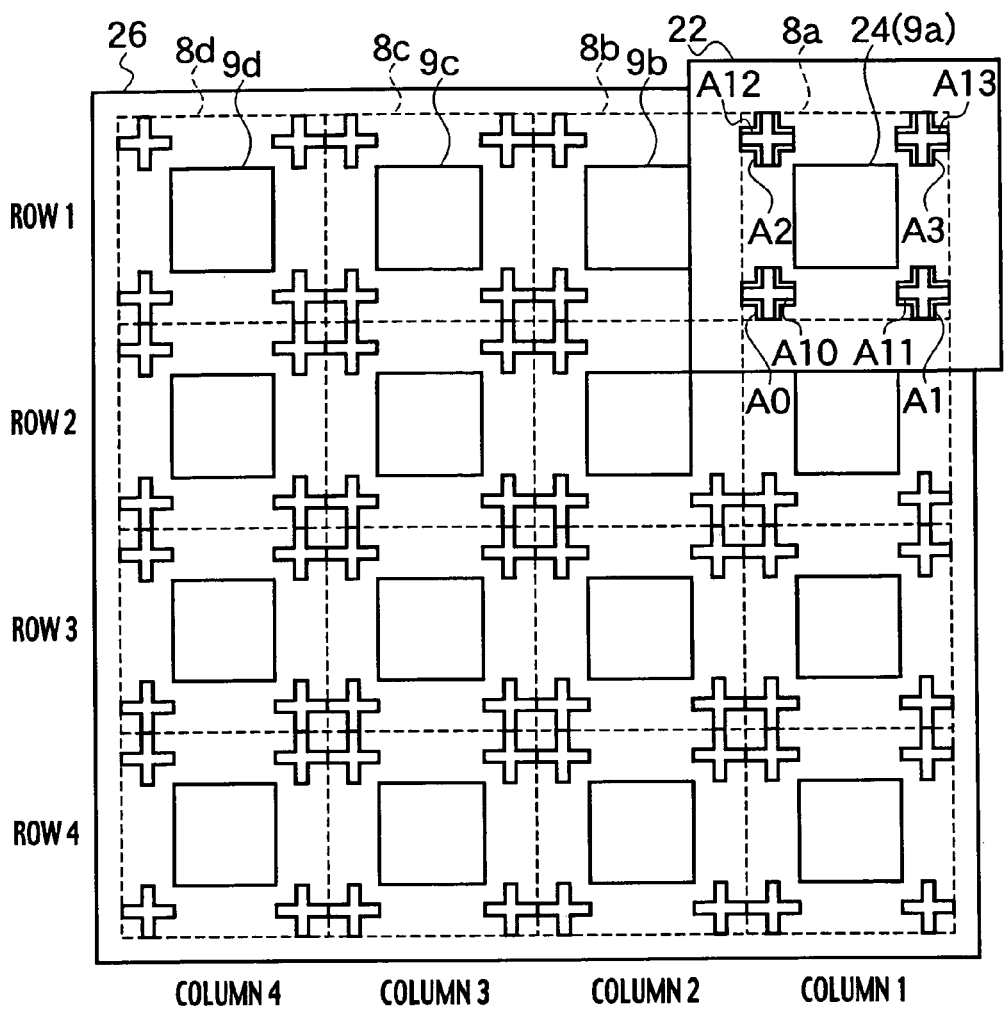
FIG. 6 shows an overlapping arrangement of a mask and a substrate to be processed when measuring dimensional difference using the semiconductor device fabrication method according to the embodiment.

In step S3, the angle adjustment unit 3 changes at least either one of the substrate angle between the vertical axis of the substrate to be processed 26 and an incident direction 16 of particles applied to the substrate to be processed, or the mask angle between the vertical axis of the mask 24 and the incident direction 16. The substrate or mask angle is changed so that: the mark A0 on the mask can accurately overlap the mark A10 on the substrate as shown in FIG. 6 when viewed along a straight line 6. The line 6 is parallel to the incident direction 16 of particles applied to the substrate to be processed 26. The mark A1 on the mask can accurately overlap the mark A11 on the substrate when viewed along a straight line 7. The line 7 runs parallel to the incident direction 16 of the particles as shown in FIG. 1. In the same way, mark A2 on the mask is overlapped with mark A12 on the substrate, and mark A3 on the mask is overlapped with mark A13 on the substrate.

Figure 7:
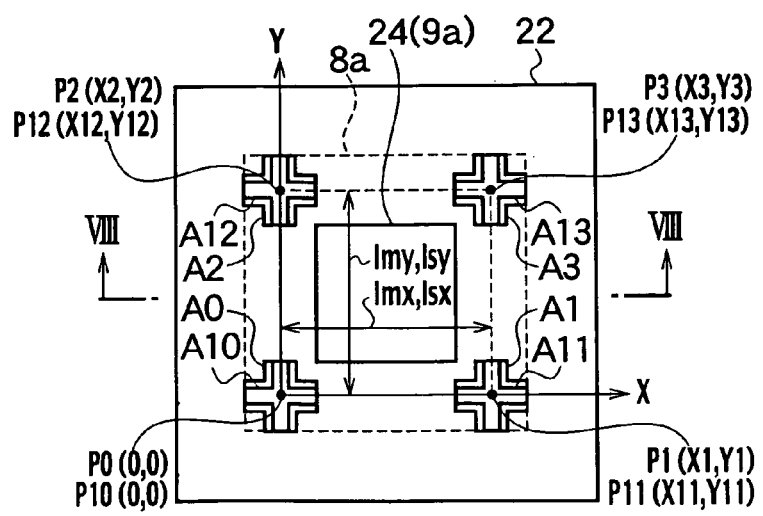
FIG. 7 shows an enlarged overlapping arrangement of a mask and a substrate to be processed when measuring dimensional difference using the semiconductor device fabrication method according to the embodiment.

More specifically, as shown in FIG. 7, when viewed in the particle incident direction 16, the center P0 of the mark A0 on the mask is overlapped with the center P10 of the mark A10 on the substrate. The center P1 of the mark A1 on the mask is overlapped with the center P11 of the mark A11 on the substrate. The center P2 of mark A2 on the mask is overlapped with the center P12 of mark A12 on the substrate; and the center P3 of mark A3 on the mask is overlapped with the center P13 of mark A13 on the substrate.

When there is no dimensional difference dx (=lmx−lsx) between a distance lmx and a distance lsx, the center P0 is overlapped with the center P10, and the center P1 is overlapped with the center P11. The distance lmx denotes the mask length between the center P0 of the mark A0 on the mask and the center P1 of the mark A1 on the mask, and the distance lsx denotes the substrate length between the center P10 of the mark A10 on the substrate and the center P11 of the mark A11 on the substrate. At this time, in step 13 of FIG. 3, the dimensional difference measurement unit 31 in FIG. 1 measures this dimensional difference dx. Alternatively, this dimensional difference dx may be a dimensional difference between the distance lmx and a distance lsx. The distance lmx denotes the mask length between the center P2 of the mark A2 on the mask and the center P3 of the mark A3 on the mask, and this distance lsx denotes the substrate length between the center P12 of the mark A12 on the substrate and the center P13 of the mark A13 on the substrate. Note that the dimensional difference dx does not need to be directly measured. In other words, the mask length lmx and the substrate length lsx may be directly measured. Moreover, the dimensional difference dx may be calculated using a measured mask length lmx and a measured substrate length lsx.

Similarly, a dimensional difference dy (=lmy−lsy) between a distance lmy and a distance lsy is measured; where the distance lmy denotes the mask length between the center P0 of the mark A0 on the mask and the center P2 of the mark A2 on the mask, and the distance lsy denotes the substrate length between the center P10 of the mark A10 and the center P12 of the mark A12 on the substrate. Alternatively, this dimensional difference dy may be a dimensional difference between the distance lmy and the distance lsy. The distance lmy denotes the mask length between the center P1 of the mark A1 on the mask and the center P3 of the mark A3 on the mask, and the distance lsy denotes the substrate length between the center P11 of the mark A11 on the substrate and the center P13 of the mark A13 on the substrate.

In step S15, the magnitude comparator 33 determines which of the mask length lmx or the substrate length lsx is greater. In the same way, the magnitude comparator 33 determines which of the mask length lmy or the substrate length lsy is greater.

In step S14, the angle calculation unit 32 calculates at least either the substrate angle or the mask angle based on the dimensional differences dx and dy. If the mask length lmx is greater than the substrate length lsx (the dimensional difference dx>0), the mask angle θmx is calculated. If the mask length lmx is less than the substrate length lsx (the dimensional difference dx<0), the substrate angle θsx is calculated. Similarly, if the mask length lmy is greater than the substrate length lsy (the dimensional difference dy>0), the mask angle θmy is calculated. If the mask length lmy is less than the substrate length lsy (the dimensional difference dy<0), the substrate angle θsy is calculated.

In step S16, the mask stage angle adjustment unit 34 and the substrate to be processed angle adjustment unit 35 set the calculated angle values to the mask angles θmx and θmy and the substrate angles θsx and θsy, respectively.

Finally, in step S4, the particle direction collimating unit 1 and the end station chamber 2 selectively irradiate particles onto the substrate to be processed 26 via the mask 22 in the parallel incident directions 37 of particle beams 36, as shown in FIG. 8. This selective irradiation allows formation of a circuit pattern 38, which is congruent with the mask circuit pattern 24, on the substrate 26. The circuit pattern 38 newly formed on the substrate to be processed 26 is deployed so that it can keep a designed overlapping positional relationship with the circuit pattern 9a on the substrate of the semiconductor device 8a. Note that the particles of the particle beams 36 may be, for example, charged particles such as electrons or ions, or non-charged particles such as photons, X-rays, atoms, or clusters.

According to the design of the semiconductor device 8a, multiple designed circuit patterns are formed, and a designed overlapping positional relationship among these multiple designed circuit patterns is decided. A fabrication flow to process the substrate to be processed 26 using the designed circuit patterns is generated. A fabrication process with the fabrication flow corresponding to each designed circuit pattern is determined. A so-called stencil mask may be used. The stencil mask is a mask circuit pattern obtained by converting a designed circuit pattern corresponding to each fabrication process and is used for that fabrication process so that the mask circuit pattern can have the same dimensions as the designed circuit pattern and being congruent with the designed circuit pattern. Alternatively, a so-called photo mask may be used for a fabrication process. The photo mask is obtained by converting from a designed circuit pattern to a similar mask circuit pattern, which is different in size from a designed circuit pattern but similar thereto and which, in particular, may be an enlarged pattern.

As shown in FIG. 8, the circuit patterns 9a on the substrate are device isolator area patterns. A mask circuit pattern 24 with through-holes 23 and 25 and circuit patterns 38 newly formed on the substrate are both ion implantation area patterns. The designed overlapping positional relationship between the device isolator area patterns 9a and the ion implantation area patterns 38 is such that each pair of device isolator area patterns 9a contact corresponding ion implantation area pattern 38, and each ion implantation area pattern 38 is formed between a corresponding pair of device isolator area patterns 9a.

The circuit patterns 9a on the substrate are formed using a photo mask. The circuit patterns 38 on the substrate are formed using a stencil mask. Since the reduction ratio for each circuit pattern 9a formed on the substrate using the photo mask may change, a certain amount of misalignment relative to the pattern coordinates may develop. In such case, the circuit patterns 9a in the substrate may be misaligned with corresponding circuit patterns 38 in the substrate, deviating from the designed overlapping positional relationship.

The ion implantation area patterns 38 in the substrate to be processed 26 are implanted with ions using the stencil mask 22. According to ion implantation using a stencil mask, ions are implanted into ion implantation area patterns 38 in the substrate to be processed 26 through the through-holes 23 and 25 formed in the stencil mask 22. In other words, the mask circuit patterns 24 in the stencil mask 22 are designed to correspond one-on-one to the circuit patterns 9a on the substrate to be processed 26. Note that in the drawing, both ends of the mask circuit patterns 24 and the circuit patterns 9a on the substrate are shown; however, illustration of the center area thereof is omitted. This is because, when misalignment occurs relative to the pattern coordinates, the amount of misalignment is greatest at both ends.

The circuit patterns 9a on the substrate are required to conform to a designed overlapping positional relationship with the circuit patterns 38 in the substrate. More specifically, even if each side of the circuit patterns 9a in the substrate is several mm to several cm long, an allowable amount of misalignment has to fall within the minimum pattern dimensions of the circuit patterns 9a in the substrate and the circuit patterns 38 in the substrate, for example, several nm to several tens of nm so that the designed overlapping positional relationship can be achieved. FIG. 8 shows a case without misalignment.

As described above, according to the embodiment, a semiconductor device fabrication method capable of correcting the dimensional difference between the circuit pattern formed on the substrate to be processed and that formed on the stencil mask can be provided. Also according to the embodiment, a semiconductor device fabrication apparatus capable of correcting the dimensional difference between the circuit pattern formed on the substrate to be processed and that formed on the stencil mask can be provided.

EXAMPLE 1

Figure 9A:
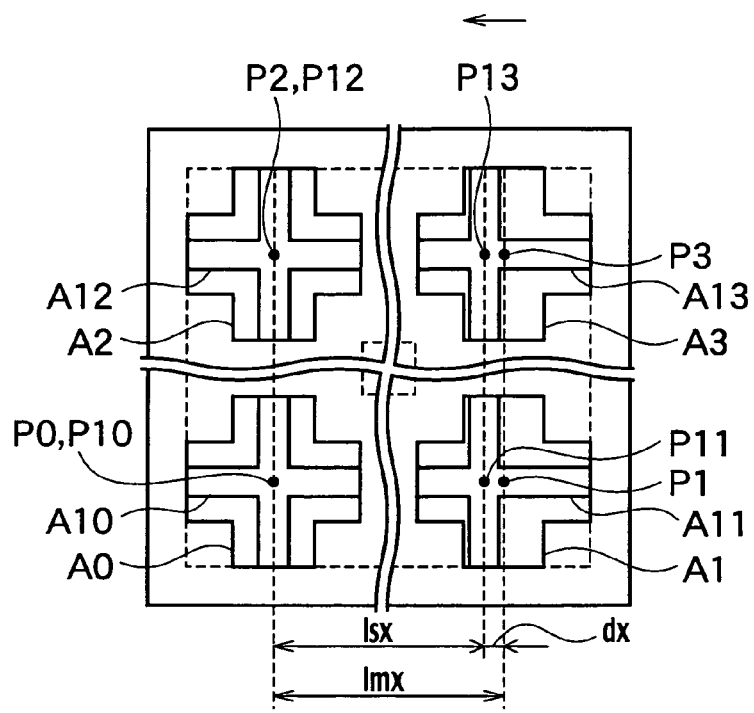
FIG. 9A shows an overlapping arrangement of a mask and a substrate to be processed when tilting the mask by dimensional difference dx>0 using a semiconductor device fabrication method according to Example 1.

Example 1 explains the case of tilting a mask 43 with dimensional difference dx>0, as shown in FIG. 9A.

FIG. 9A shows the mask 22 overlapped with the substrate to be processed 26 when viewed along the particle incident direction 16 as with FIG. 6 and FIG. 7. To begin with, in order to facilitate measurement of the dimensional differences dx and dy, the center P0 of the mark A0 on the mask is overlapped with the center P10 of the mark A10 on the substrate. The center P1 of the mark A1 on the mask may not exactly overlap the center P11 of the mark A11 on the substrate, and the centers P1 and P11 are separated by the dimensional difference dx. The mask length lmx between the centers P0 and P1 is longer than the substrate length lsx between the centers P10 and P11 by a dimensional difference dx. At this time, the center P2 of the mark A2 on the mask overlaps the center P12 of the mark A12 on the substrate; however, the center P3 of the mark A3 on the mask does not overlap the center P13 of the mark A13 on the substrate, and the centers P3 and P13 are separated by only the dimensional difference dx. This result means that the size of the mask circuit pattern 24 is enlarged relative to the size of the substrate circuit pattern 8a at a ratio of dimensional difference dx per substrate length lsx along the X-axis. On the other hand, this may mean that the substrate to be processed 26 is reduced in size relative to the mask 22 at a ratio of dimensional difference dx per mask length lmx along the X-axis.

As shown in FIG. 10, if there is a dimensional difference dx, undesired areas as well as desired areas are subjected to ion implantation. This is because, compared to each mask circuit pattern 24 formed on the mask 22, the circuit pattern 8a formed on the substrate to be processed 26 is smaller.

Figure 9B:
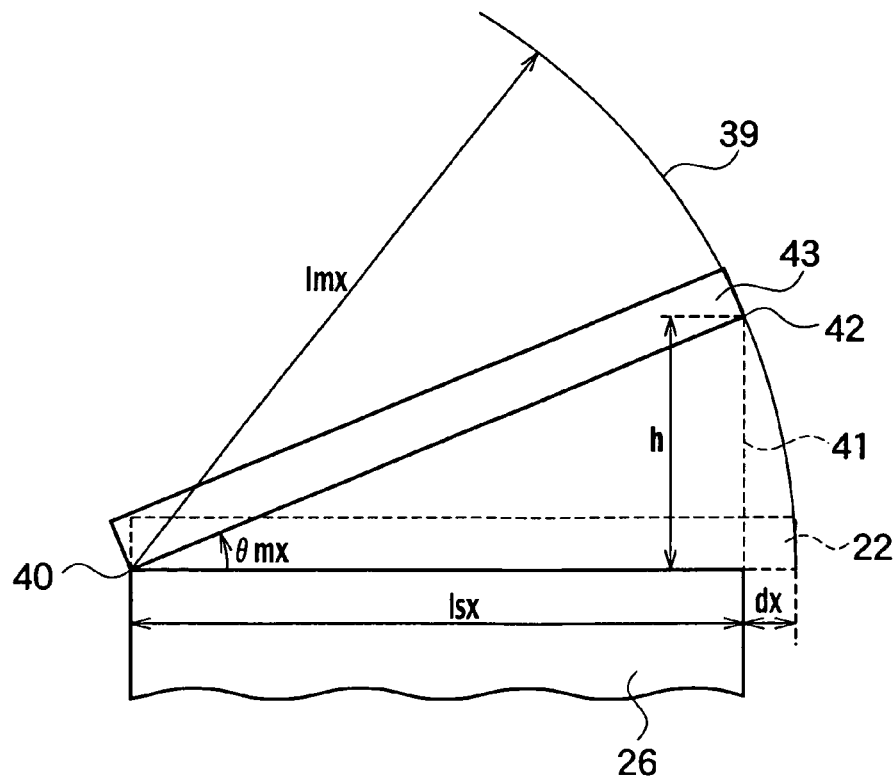
FIG. 9B shows an outline of a relationship among an on-mask distance, an on-substrate distance, a dimensional difference dx, and a mask angle.
Figure 11:
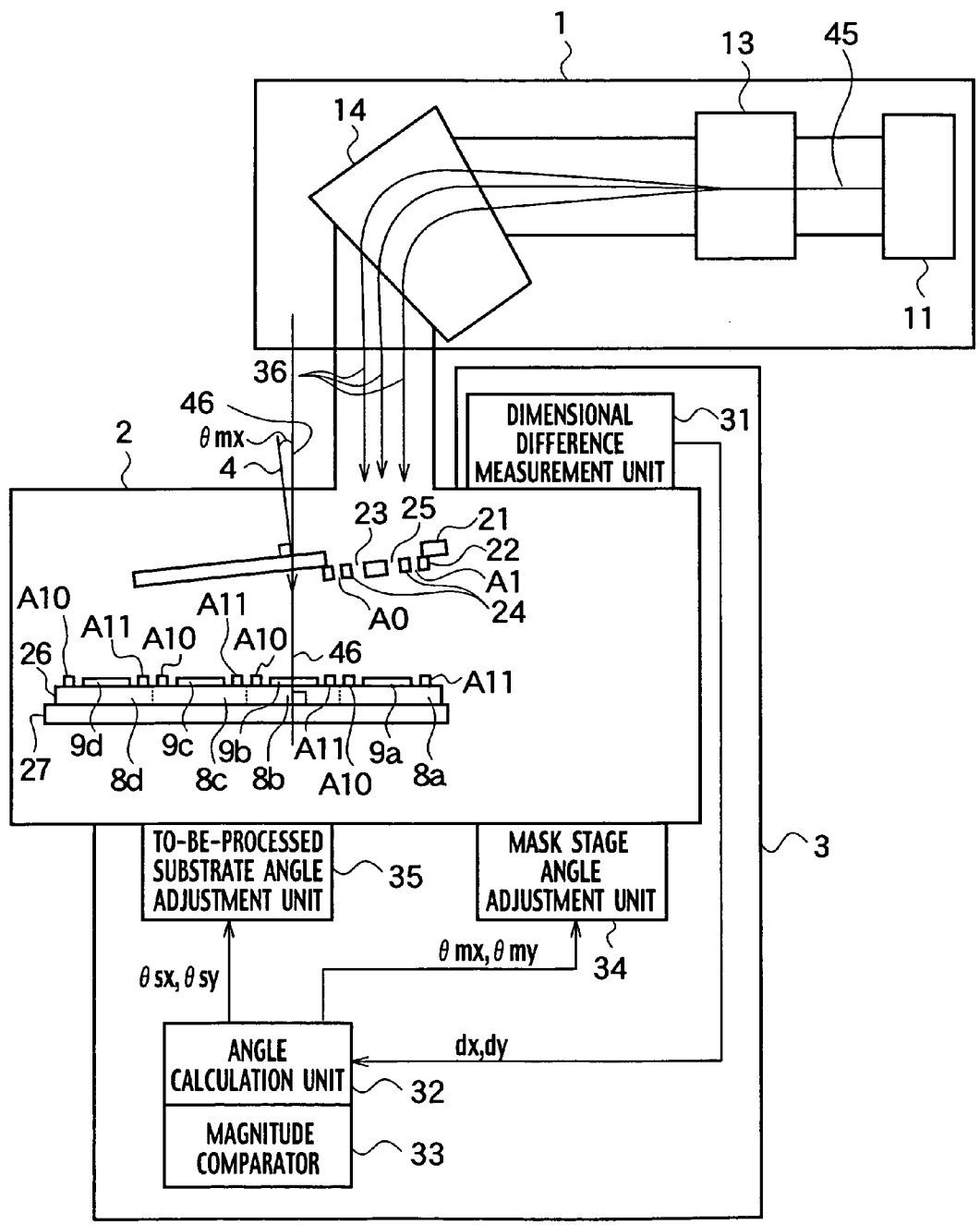
FIG. 11 shows a structure of a semiconductor device fabrication apparatus when selectively irradiating on a substrate to be processed taking the mask angle into account using the semiconductor device fabrication method according to Example 1 in the case where there is a dimensional difference.

Accordingly, with Example 1 as shown in FIG. 9B, the angle adjustment unit 3 tilts the mask 22 towards mask 43 relative to a plane with a straight line 41 as a perpendicular line, which runs parallel to the particle incident direction, more specifically, the surface of the substrate to be processed 26. The mask 22 is tilted in conformity with the dimensional difference dx measured by the dimensional difference measurement unit 31. One end of the substrate length lsx and one end of the mask length lmx are made to meet at the center 40 of the circular arc. At the other end of the substrate length lsx and the end of the mask length lmx, the dimensional difference dx develops according to the magnitude relation determined by the magnitude comparator 33. Next, the angle calculation unit 32 calculates a mask angle θmx. With the center 40 of the circular arc as a center, and with the mask length lmx as a radius, a circular arc 39 is drawn. A straight line 41, which runs parallel to the particle incident direction and passes through the other end of the substrate length lsx, is drawn. The circular arc 39 crosses the straight line 41 at an intersection 42. The angle between the plane on which the intersection 42 and the center 40 of the circular arc are located and the plane with a straight line 41 as a perpendicular line, more specifically, the surface of the substrate to be processed 26, is a mask angle θmx. As shown in FIG. 11, the mask stage angle adjustment unit 34 tilts the mask 22 by the mask angle θmx in conformity with the calculated mask angle θmx by increasing the angle of the mask stage 21 by the mask angle θmx.

Note that in FIG. 9B, assuming that the substrate length lsx and the mask length lmx are 1 cm, the dimensional difference dx may be assumed to be 100 nm at most. Regarding the mask angle θmx, the relationship represented by Expression 1 and Expression 2 is provided. By substituting Expression 1 for Expression 2, Expression 3 is determined. Since the mask length lmx is one hundred thousand times the dimensional difference dx, and the second term on the right side of Expression 3 is considerably smaller than the first term, Expression 3 can be approximated as Expression 4. The difference between the shortest and the longest distance h from the mask 43 to the substrate to be processed 26, which is due to tilting the mask 43, is represented by Expression 5.

$$lmx-lsx=dx \tag{1}$$

$$lmx*\cos θmx=lsx \tag{2}$$

$$\sin^2 θmx=2*dx/lmx-(dx/lmx)^2 \tag{3}$$

$$\sin^2 θmx \sim 2*dx/lmx \tag{4}$$

$$h=lmx*\sin θmx \sim (2*dx*lmx)^{1/2} \tag{5}$$

More specifically, assuming 1 cm and 100 nm for the mask length lmx and the dimensional difference dx in Expression 5, respectively, provides a maximum difference h of 40 to 50, m, and a mask angle θmx as a fraction of one degrees at less than 1 degrees.

Figure 12:
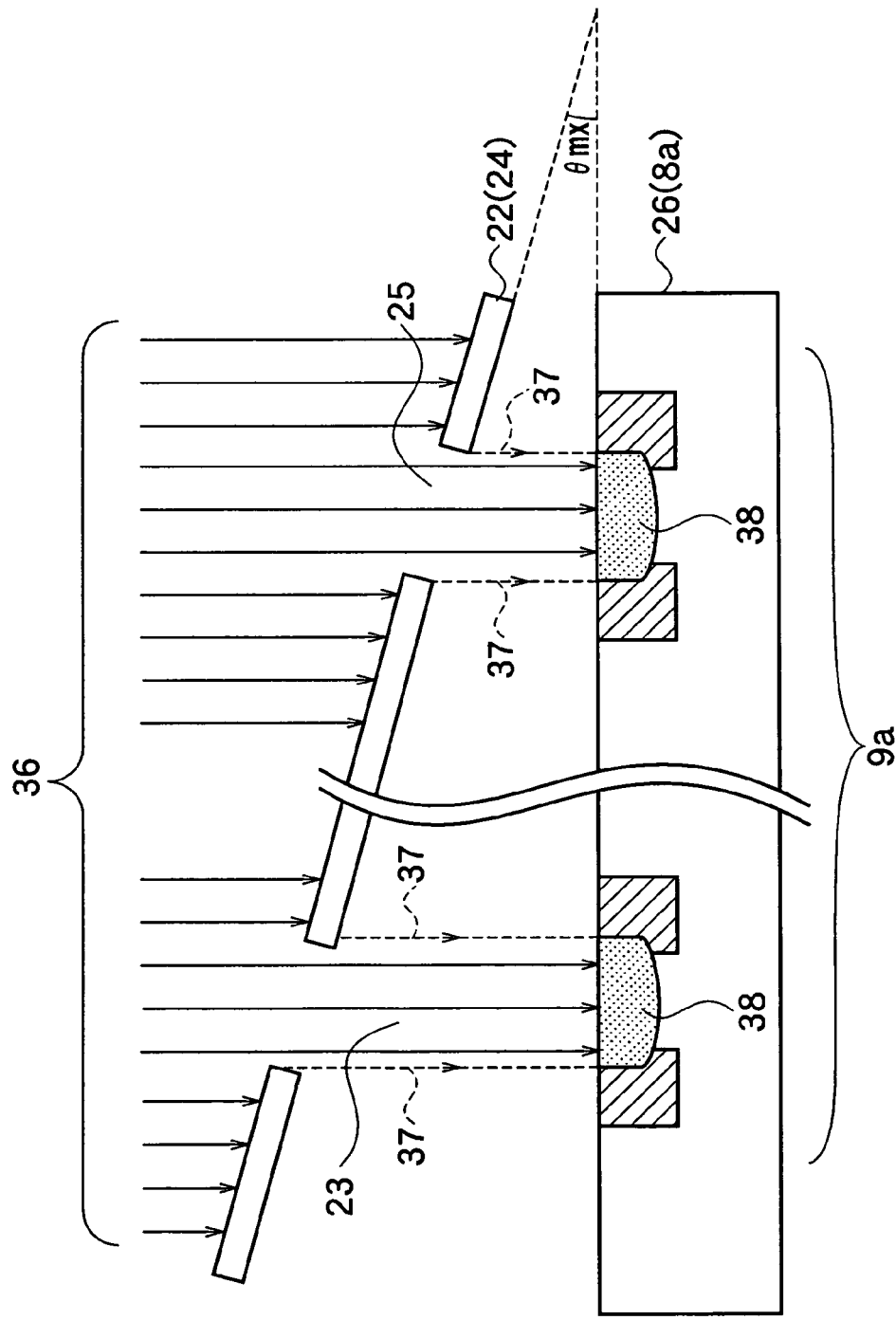
FIG. 12 shows a cross section of a mask and a substrate to be processed when selectively irradiating on a substrate to be processed taking the mask angle into account in the case of tilting the mask by dimensional difference dx>0 using the semiconductor device fabrication method according to Example 1.

As shown in FIG. 12, by tilting the mask 22 with the mask angle θmx, ions can be implanted into a desired area. When there is a dimensional difference dx between the substrate length lmx that is a circuit size of the substrate to be processed 26 and mask length that is a circuit size of mask 22, this dimensional difference dx can be corrected. Therefore, the circuit size of the fabricated mask 22 relative to the circuit size of the designed circuit pattern can be corrected. The enlarged or reduced circuit size of the circuit patterns 9a to 9d formed on the substrate to be processed 26 due to differences among pattern formation methods and apparatuses can be corrected.

Figure 13:
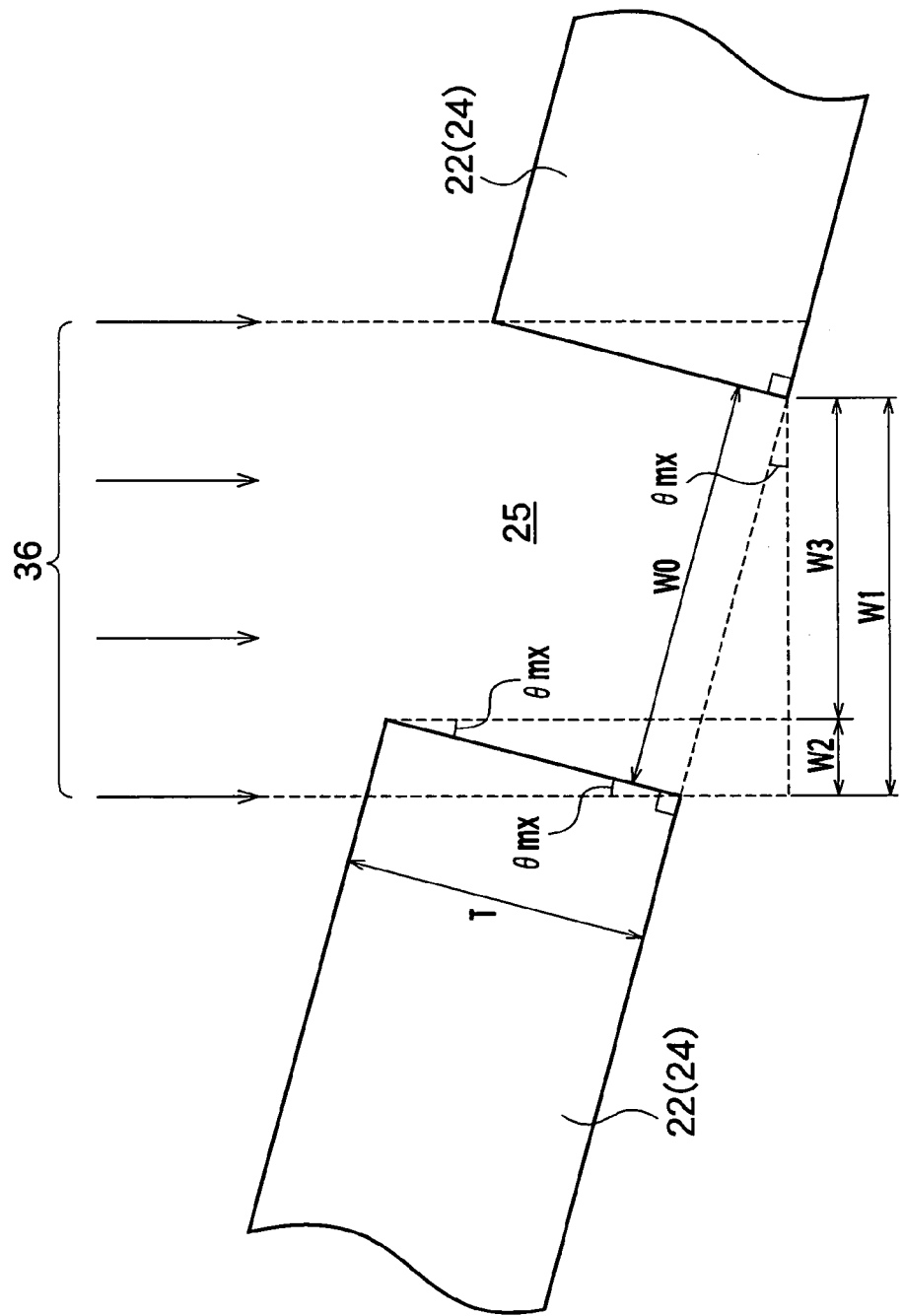
FIG. 13 is an enlargement of a cross section around a through-hole of a mask circuit pattern in FIG. 12.

As shown in FIG. 13, by tilting the mask 22, the width of through-hole 25 in the mask circuit pattern is narrowed from width W0 to width W1 when seen along the particle beams 36. Moreover, since the mask 22 is a thickness T, the width of through-hole 25 in the mask circuit pattern is narrowed by width W2 to width W3 when seen along the particle beams 36.

Figure 14:
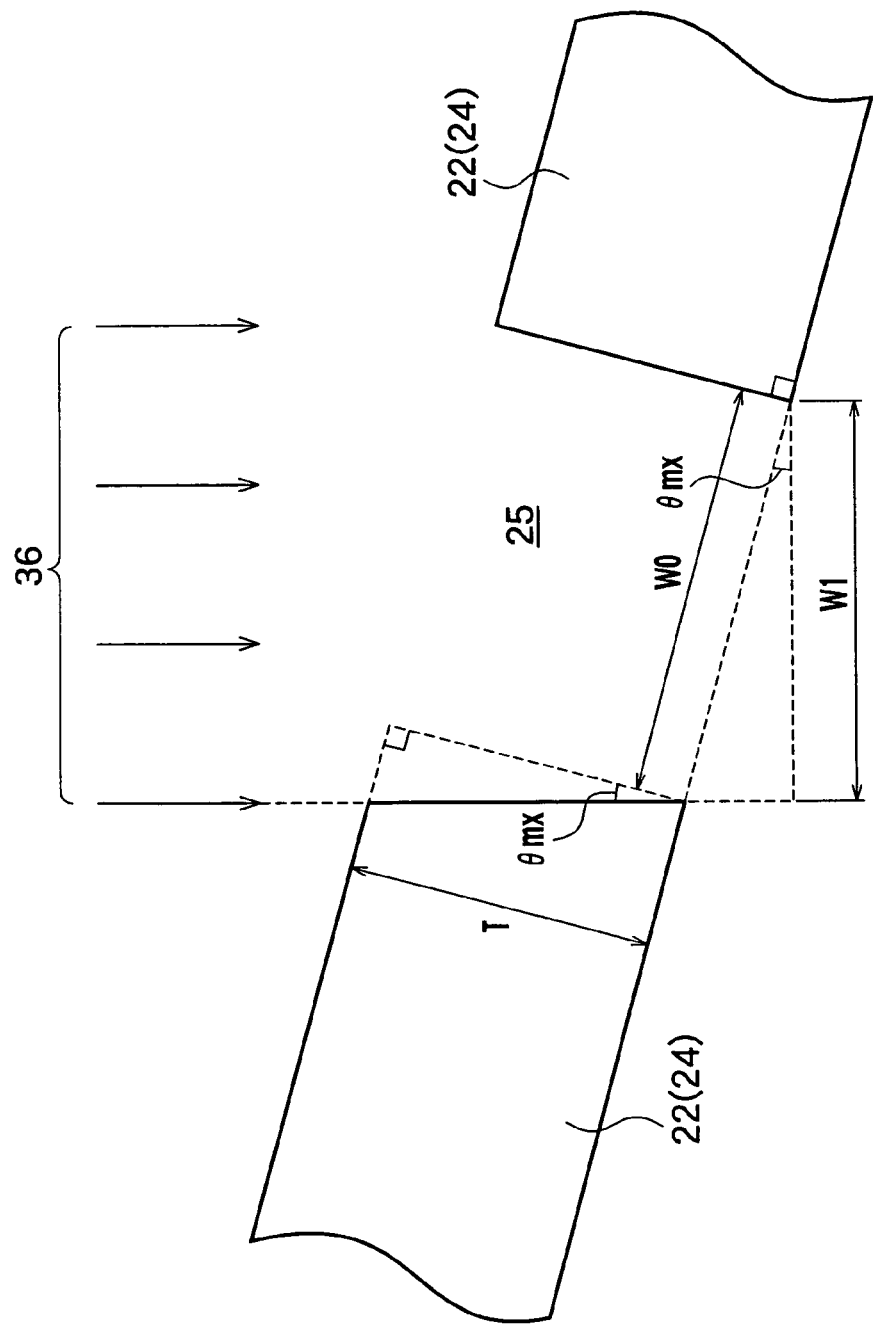
FIGS. 14 to 17 show modified examples of the through-hole of the mask circuit pattern in FIG. 13.
Figure 15:
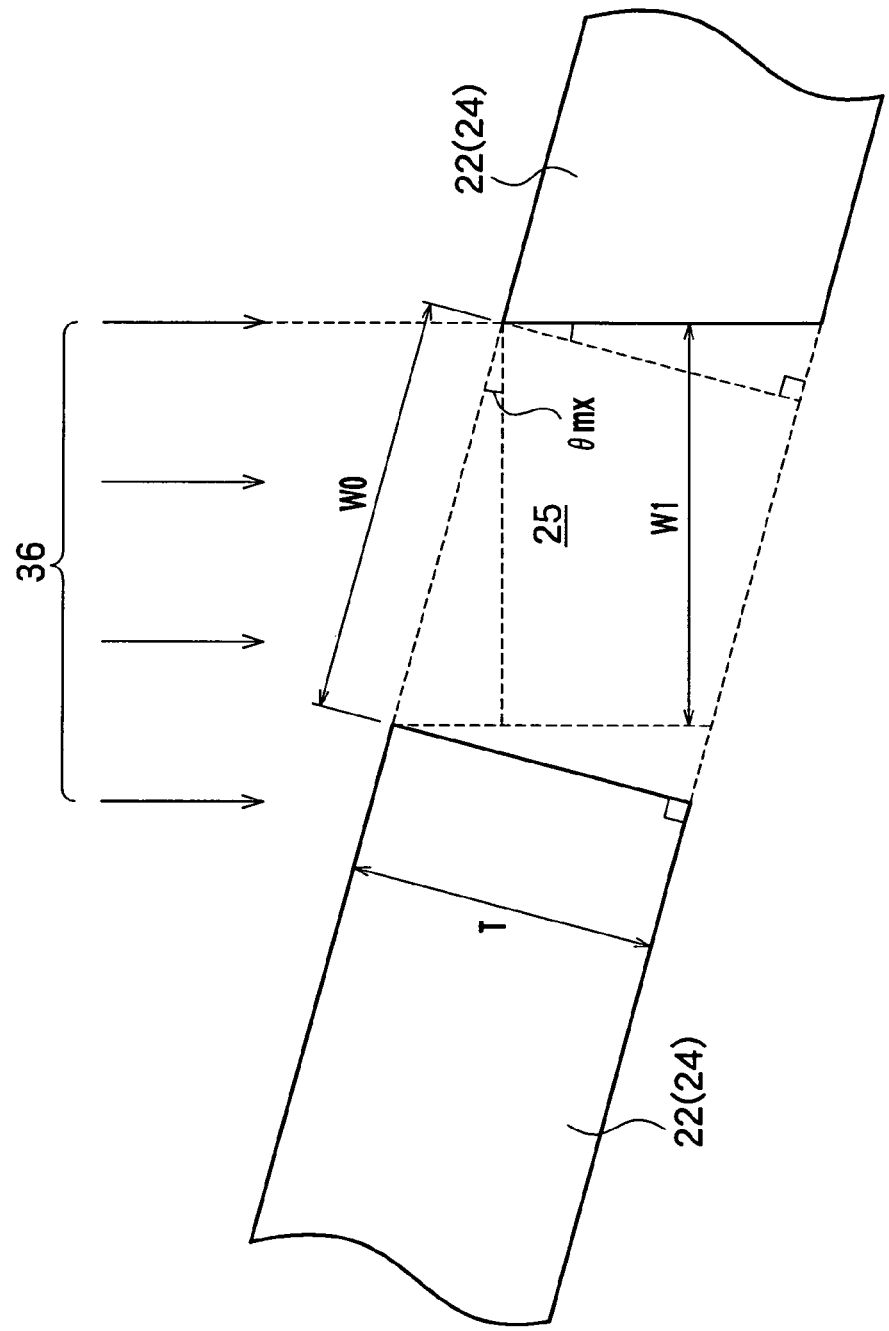
Figure 16:
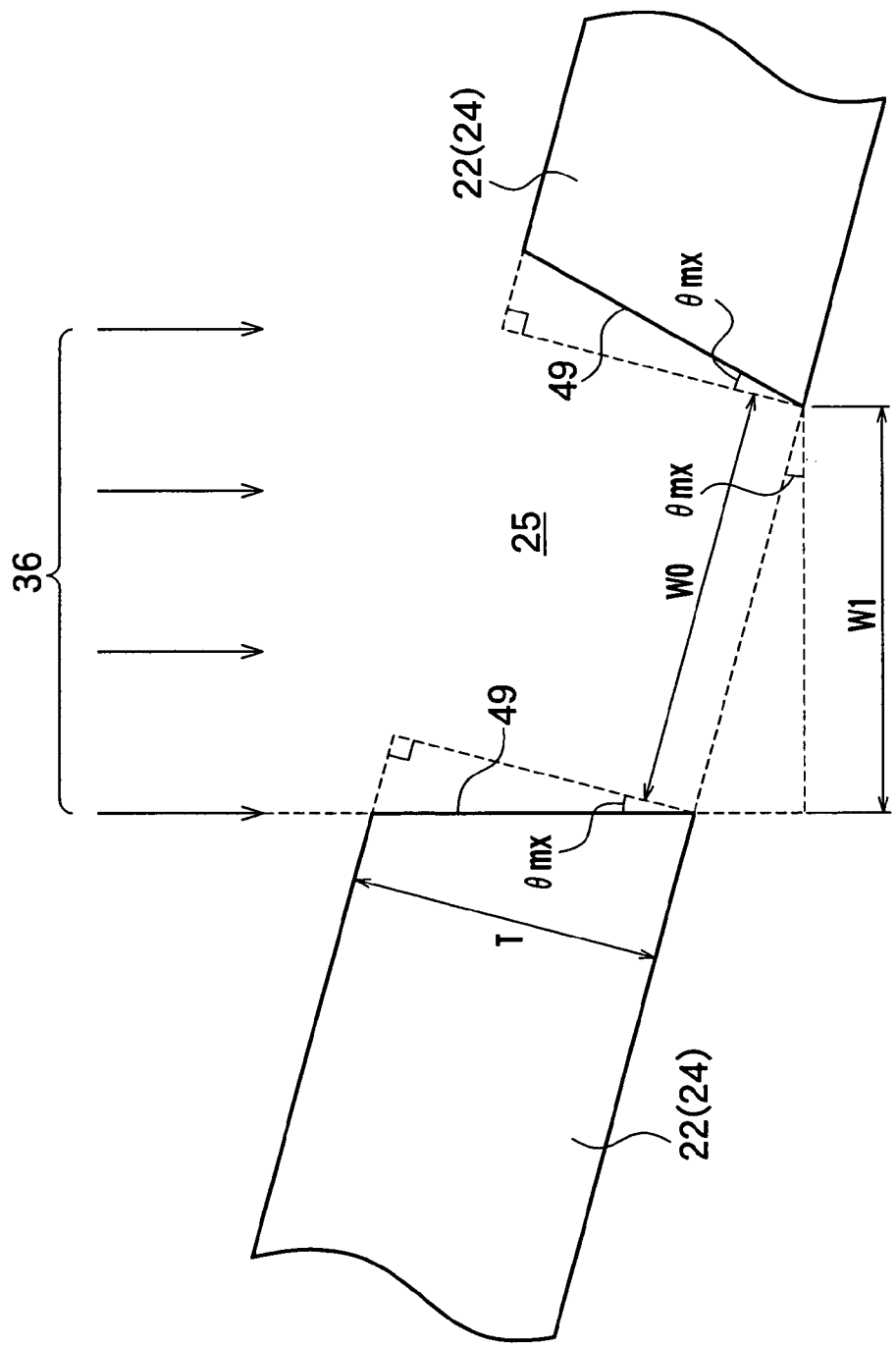
Figure 17:
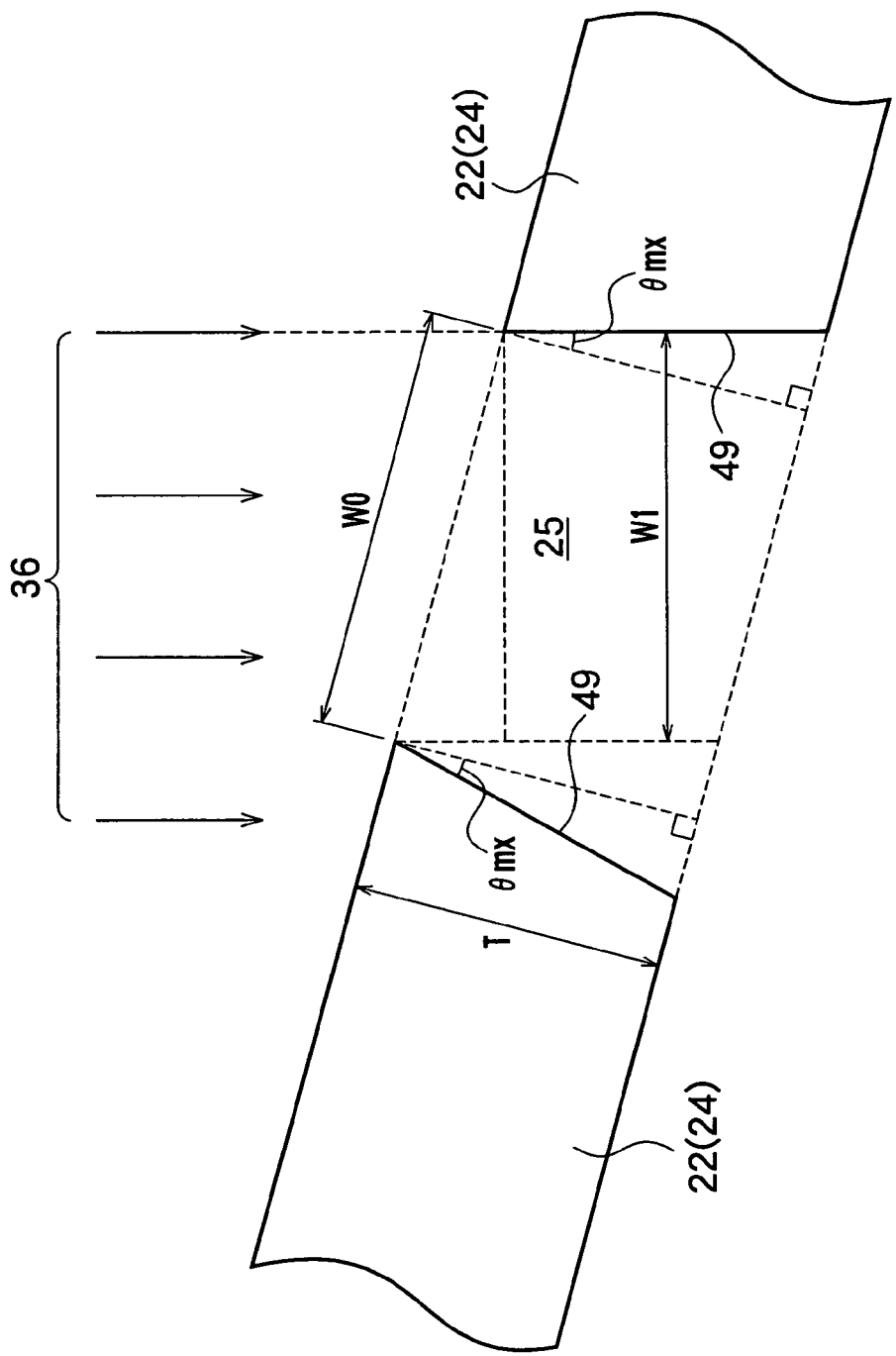

Here, suppose the thickness T of the mask 22 is, for example, 2, m, the substrate length lsx and the mask length lmx is 1 cm, and the dimensional difference dx is 100 nm at most. The width W2 is T*sin θmx and is 8 to 10 nm at most. This value falls within an allowable amount of misalignment. Note that in order to prevent the width of through-hole 25 in the mask circuit pattern from being narrowed by width W2 when seen along the particle beams 36, a side 49 of through-hole 25 with a normal running parallel to the X direction is forward tapered in the same direction as the particle beams 36, as shown in FIG. 14. The angle of this taper is set to the maximum value of allowable mask angles θmx. Similarly, as shown in FIG. 15, a side 49 of through-hole 25 with a normal running parallel to the X direction and with the same direction is reverse tapered in the reverse direction to the particle beams 36. This also prevents the width of through-hole 25 in the mask circuit pattern when seen along the particle beams 36 from being narrowed by width W2. Moreover, a side 49 of through-hole 25 with a normal running parallel to the X direction or all sides 49 of through-hole 25 may be forward tapered with respect to the particle beams 36 as shown in FIG. 16. Alternatively and similarly, a side 49 of through-hole 25 with a normal running parallel to the X direction or all the sides 49 of through-hole 25 may be reverse tapered with respect to the particle beams 36 as shown in FIG. 16.

As described above, according to Example 1, a semiconductor device fabrication method is provided that is capable of correcting the dimensional difference between the circuit patterns formed on the substrate to be processed and the stencil mask, respectively. Also according to Example 1, a semiconductor device fabrication apparatus is provided that is capable of correcting the dimensional difference between the circuit patterns formed on the substrate to be processed and the stencil mask, respectively.

EXAMPLE 2

Figure 18A:
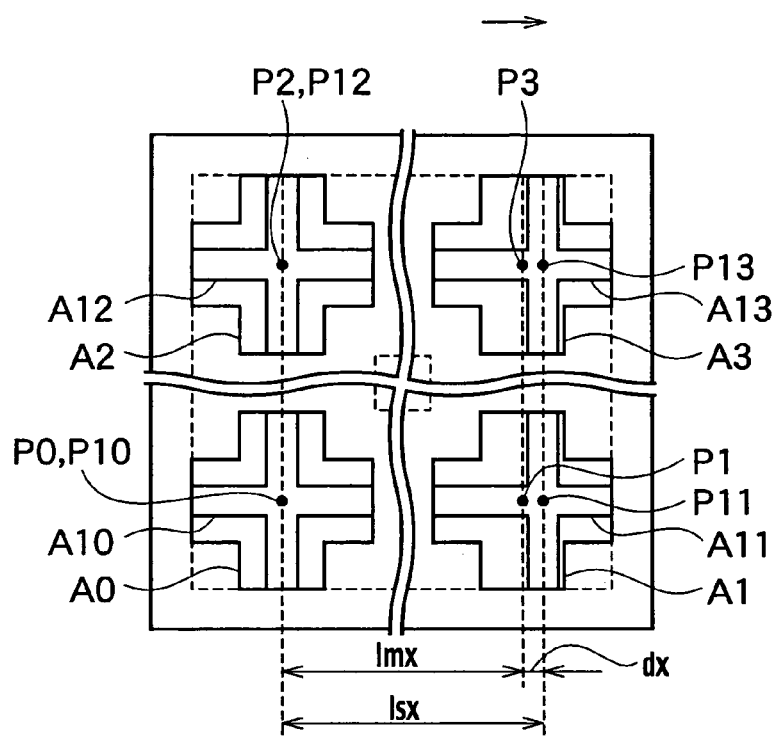
FIG. 18A shows an overlapping arrangement of a mask and a substrate to be processed when tilting a substrate to be processed by dimensional difference dx<0 using a semiconductor device fabrication method according to Example 2.

With Example 2, the case of tilting the substrate to be processed 26 with dimensional difference dx<0 as shown in FIG. 18A is explained. According to Example 2, contrary to Example 1, the substrate length lsx of the substrate to be processed 26 is longer than the mask length lmx of the mask 22.

In FIG. 18A, the mask 22 and the substrate to be processed 26 are overlapped with each other when viewed along the particle incident direction 16 as in FIGS. 6 and 7. To begin with, the center P0 of the mark A0 on the mask is overlapped with the center P10 of the mark A10 on the substrate. The center P1 of the mark A1 on the mask does not overlap the center P11 of the mark A11 on the substrate, and the centers P1 and P11 are separated by a dimensional difference dx. The mask length lmx between the centers P0 and P1 is shorter than the substrate length lsx between the centers P10 and P11 by a dimensional difference dx. At this time, the center P2 of the mark A2 on the mask overlaps the center P12 of the mark A12 on the substrate. However, the center P3 of the mark A3 on the mask does not overlap the center P13 of the mark A13 on the substrate, and the centers P3 is apart from the center P13 are separated by dimensional difference dx. This means that the mask 22 may be reduce relative to the substrate to be processed 26 in the X direction at a ratio of dimensional difference dx per substrate length lsx. In other perspective, this means that the substrate to be processed 26 may be enlarged relative to the mask 22 in the X direction at a ratio of dimensional difference dx per mask length lmx.

Figure 19:
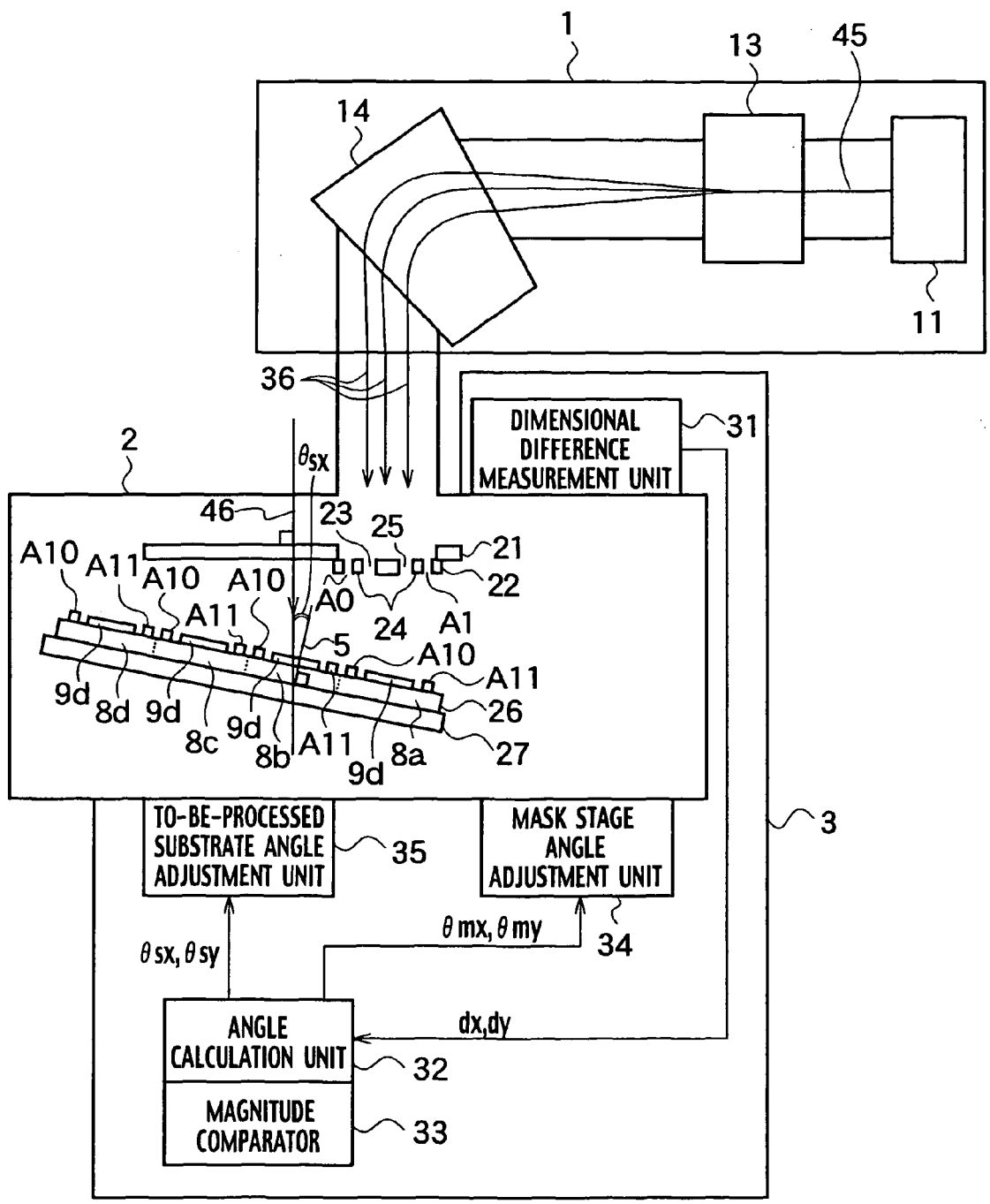
FIG. 19 shows a structure of a semiconductor device fabrication apparatus when selectively irradiating on a substrate to be processed taking the substrate angle into account using the semiconductor device fabrication method according to Example 2 in the case where there is a dimensional difference.

Therefore, according to Example 2, as shown in FIG. 18A, the substrate to be processed 26 is tilted toward a position of the substrate 47 relative to the plane with a straight line 41 running parallel to the particle incident direction as a perpendicular line, more specifically, the surface of the mask 22. The substrate to be processed 26 is tilted in conformity with the dimensional difference dx. One end of the substrate length lsx is made to meet one end of the mask length lmx at the center 40 of the circular arc. At the other end of the substrate length lsx and the other end of the mask length lmx, the dimensional difference dx occurs. Next, a substrate angle. θsx is calculated. Regarding the center 40 of the circular arc as a center, and the substrate length lsx as a radius, a circular arc 39 is drawn. A straight line 41 passing through the other end of the mask length lmx and running parallel to the particle incident direction is drawn. The circular arc 39 intersects with the straight line 41 at the intersection 42. The angle between the plane on which the intersection 42 and the center 40 of the circular arc, and the plane with a straight line 41 as a perpendicular line, more specifically, the surface of the mask 22, is a substrate angle θsx. As shown in FIG. 19, the substrate to be processed angle adjustment unit 35 tilts the substrate stage 27 by the calculated substrate angle θsx so that the substrate to be processed 26 can tilt by the substrate angle θsx.

Figure 20:
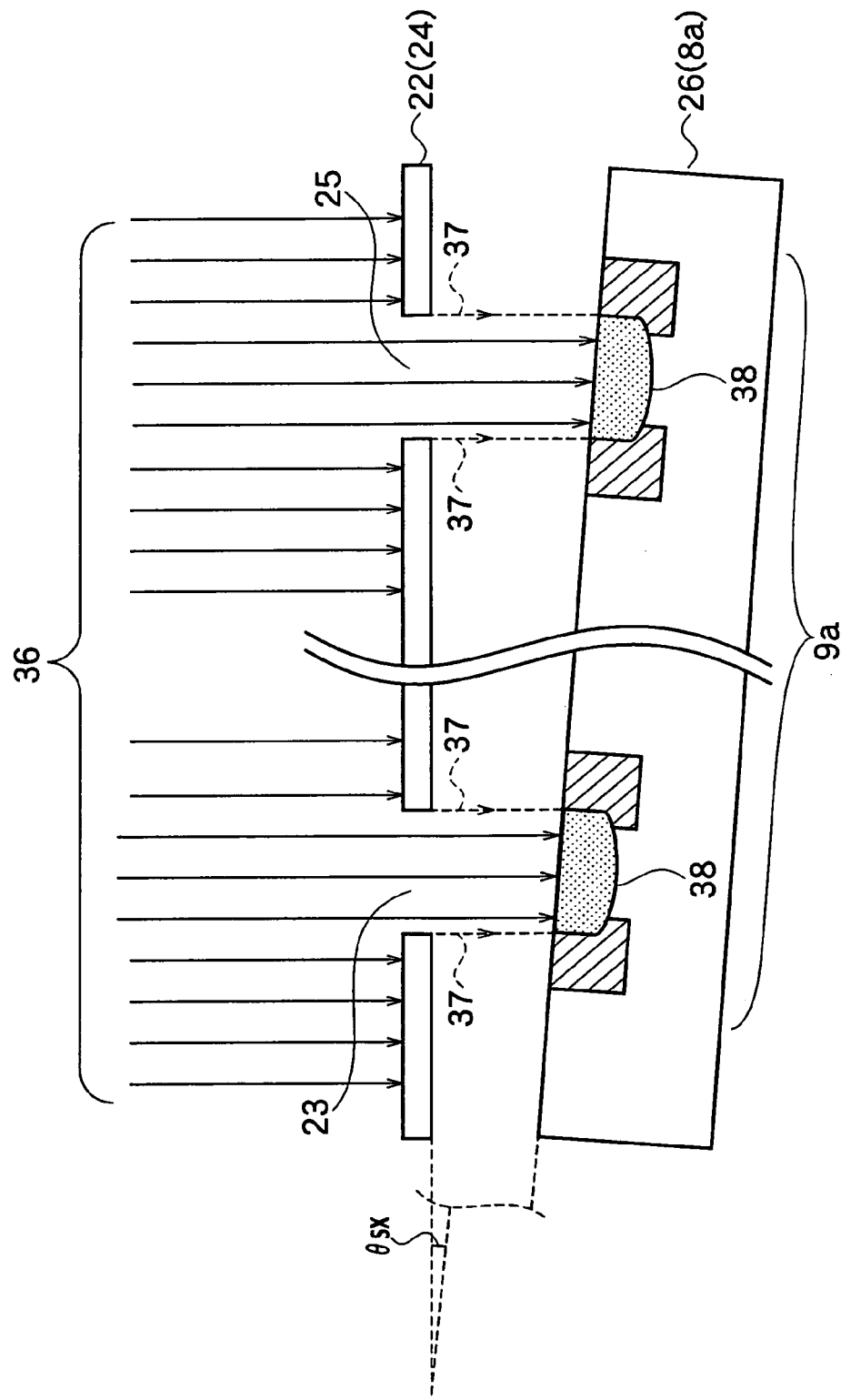
FIG. 20 is a cross section of a mask and a substrate to be processed when selectively irradiating on a substrate to be processed taking the substrate angle into account in the case of tilting the substrate to be processed by dimensional difference dx<0 using the semiconductor device fabrication method according to Example 2.

As shown in FIG. 20, by tilting the substrate to be processed 26 by the substrate angle θsx, ions can be implanted into a desired area. In the case where there may be a dimensional difference dx<0 between the substrate length lmx that is a circuit size of the substrate to be processed 26 and the mask length that is a circuit size of the mask 22, in other words in the case of the mask 22 being smaller that the substrate to be processed 26, this dimensional difference dx can be corrected. Note that since the distance h between the mask 22 and the substrate to be processed 26 and the substrate angle θsx can be calculated in the same way as for the distance h and the mask angle θmx in Example 1 and the calculated values therefore are almost the same, explanation thereof is omitted.

As described above, according to Example 2, a semiconductor device fabrication method is provided that is capable of correcting the circuit pattern dimensional difference between the substrate to be processed and the stencil mask. Also according to Example 2, a semiconductor device fabrication apparatus is provided that is capable of correcting the circuit pattern dimensional difference between the substrate to be processed and the stencil mask.

EXAMPLE 3

Figure 21A:
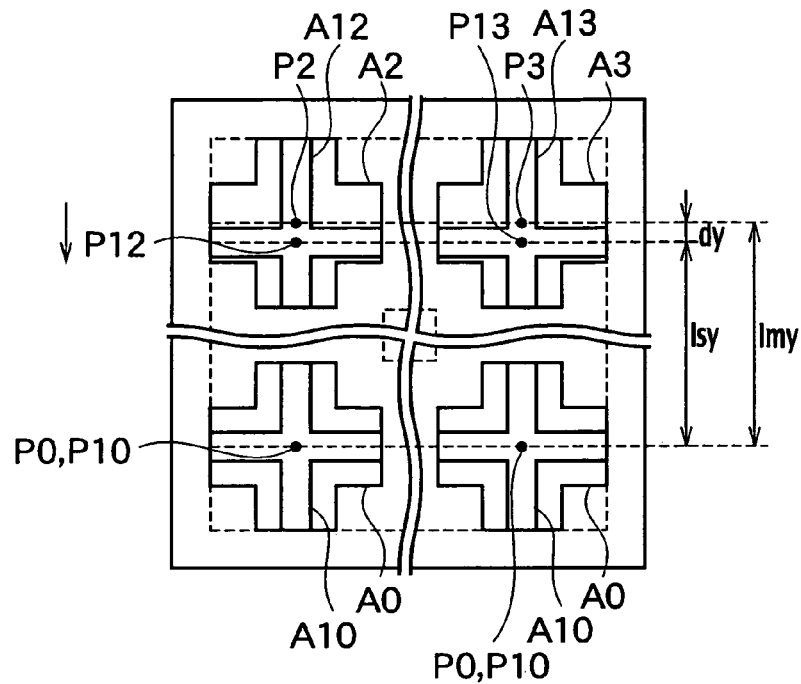
FIG. 21A shows an overlapping arrangement of a mask and a substrate to be processed in the case of tilting the mask by dimensional difference dy>0 using a semiconductor device fabrication method according to Example 3.

According to Example 3, the case of tilting the mask 22, given dimensional difference dy>0 as shown in FIG. 21A is explained. Example 3 is different from Example 1 in that the dimensional difference dy does not extend in the X direction, but only in the Y direction.

In FIG. 21A, the mask 22 is overlapped with the substrate to be processed 26 when viewed along the particle incident direction 16 as in FIGS. 6 and 7. To begin with, the center P0 of the mark A0 on the mask is overlapped with the center P10 of the marks A10 on the substrate. However, the center P2 of the mark A2 on the mask does not overlap the center P12 of the mark A12, and the centers P2 and P12 are separated by a dimensional difference dy. The mask length lmy between the centers P0 and P2 is longer than the substrate length lsy between the centers P10 and P12 by the dimensional difference dy. At this time, the center P1 of the mark A1 on the mask overlaps the center P11 of the mark A11 on the substrate. However, the center P3 of the mark A3 on the mask does not overlap the center P13 of the mark A13 on the substrate, and the centers P3 and P13 are separated by the dimensional difference dy. This means that the mask 22 may be enlarged relative to the substrate to be processed 26 at a ratio of dimensional difference dy per substrate length lsy in the Y direction. Otherwise, this means that the substrate to be processed 26 may be reduced relative to the mask 22 at a ratio of dimensional difference dy per mask length lmy in the Y direction.

Figure 21B:
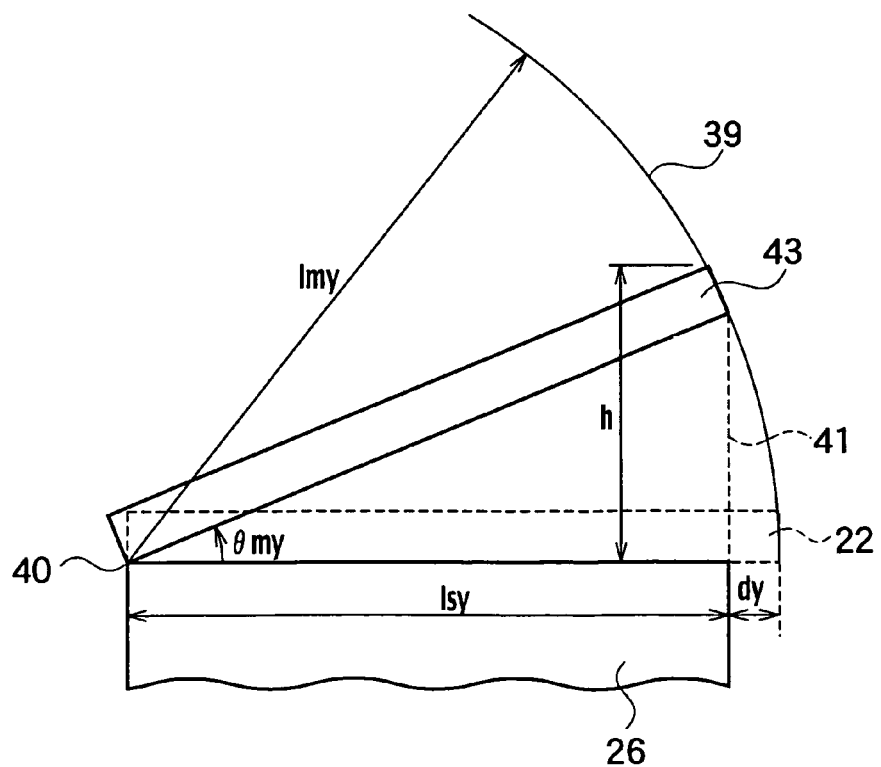
FIG. 21B shows an outline of a relationship among a mask length, a substrate length, a dimensional difference dy, and a mask angle.

Therefore, according to Example 3, as shown in FIG. 21B, the mask 22 is tilted toward a mask 43 relative to a plane with a straight line 41 running parallel to the particle incident direction as a perpendicular line, more specifically, the surface of the substrate to be processed 26. The mask 22 is tilted in conformity with the dimensional difference dy. One end of the substrate length lsy and one end of the mask length lmy are made to meet at the center 40 of the circular arc. At the other end of the substrate length lsy and the other end of the mask length lmy, a dimensional difference dy occurs. Next, a mask angle θmy is calculated. With the center 40 of the circular arc as a center, and the mask length lmy as a radius, a circular arc 39 is drawn. A straight line 41 passing through the other end of the substrate length lsy and running parallel to the particle incident direction is drawn. The circular arc 39 intersects with the straight line 41 at the intersection 42. The angle between a plane on which the intersection 42 and the center 40 of the circular arc, and the plane with the straight line 41 as a perpendicular line, more specifically, the surface of the substrate to be processed 26, is a mask angle θmy. The mask 22 is tilted by the calculated mask angle θmy. This allows implantation of ions into a desired area. In the case where there is a dimensional difference dy between the substrate length lmy that is a circuit size of the substrate to be processed 26 and the mask length lmy that is a circuit size of the mask 22, and also in the case of the dimensional difference dy>0, in other words, even in the case of the mask 22 being larger than the substrate to be processed 26, the dimensional difference dy can be corrected.

As described above, according to Example 3, a semiconductor device fabrication method capable of correcting a circuit pattern dimensional difference between the substrate to be processed and the stencil mask can be provided. Also, according to Example 3, a semiconductor device fabrication apparatus capable of correcting a circuit pattern dimensional difference between the substrate to be processed and the stencil mask can be provided.

EXAMPLE 4

Figure 22A:
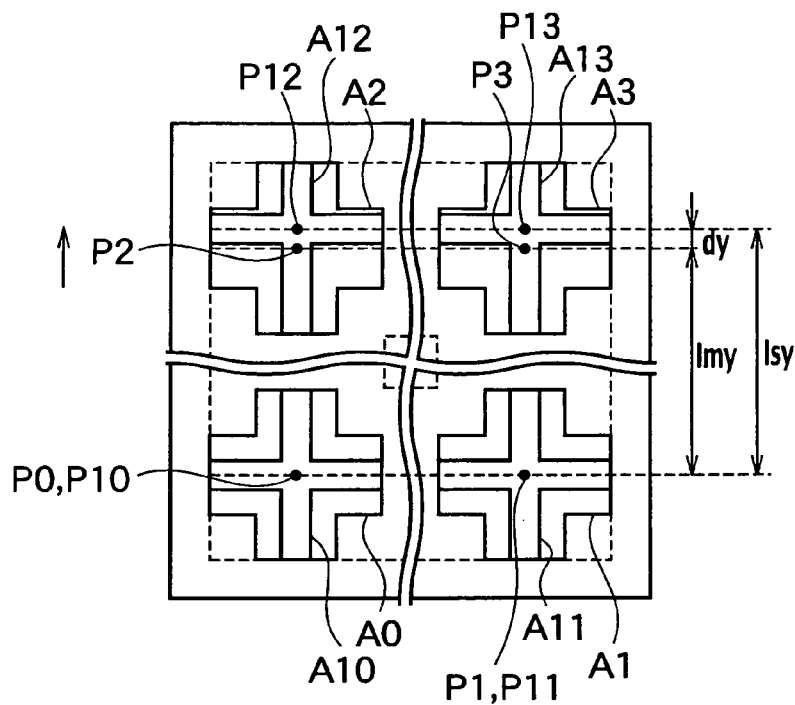
FIG. 22A shows an overlapping arrangement of a mask and a substrate to be processed in the case of tilting a substrate to be processed by dimensional difference dy<0 using a semiconductor device fabrication method according to Example 4.

According to Example 4, the case of tilting the substrate to be processed 26 given a dimensional difference dy<0 as shown in FIG. 22A is explained. According to Example 4, contrary to Example 3, the substrate length lsy of the substrate to be processed 26 is longer than the mask length lmy of the mask 22.

In FIG. 22A, the mask 22 is overlapped with the substrate to be processed 26 when viewed along the particle incident direction 16 as in FIGS. 6 and 7. To begin with, the center P0 of the mark A0 on the mask is overlapped with the center P10 of the mark A10. The center P2 of the mark A2 on the mask does not overlap the center P12 of the mark A12 on the substrate, and the centers P2 and P12 are separated by a dimensional difference dy. The mask length lmy between the centers P0 and P2 is shorter than the substrate length lsy between the centers P10 and P12 by the dimensional difference dy. At this time, the center P1 of the mark A1 on the mask overlaps the center P11 of the mark A11 on the substrate. However, the center P3 of the mark A3 on the mask does not overlap the center P13 of the mark A13 on the substrate, and the centers P3 and P13 are separated by the dimensional difference dy. This means that the mask 22 may be reduced relative to the substrate to be processed 26 at a ratio of dimensional difference dy per substrate length lsy in the Y direction. Otherwise, this means that the substrate to be processed 26 may be enlarged relative to the mask 22 at a ratio of dimensional difference dy per mask length lmy in the Y direction.

Figure 22B:
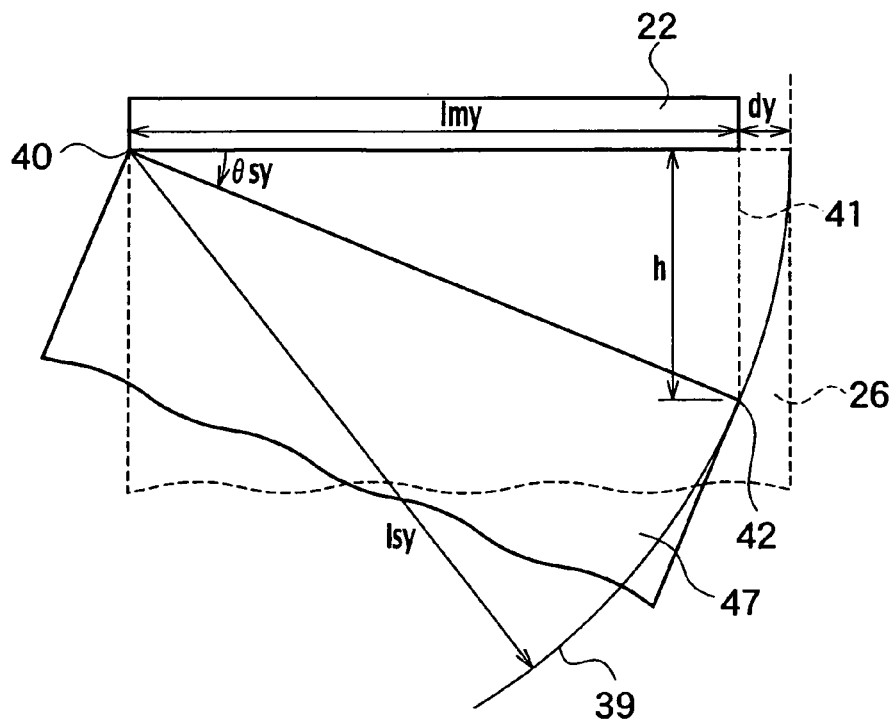
FIG. 22B shows an outline of a relationship among a mask length, a substrate length, a dimensional difference dy, and a substrate angle.

Therefore, according to Example 4, as shown in FIG. 22B, the substrate to be processed 26 is tilted toward a position of the substrate 47 relative to a plane with a straight line 41 extending parallel to the particle incident direction as a perpendicular line, more specifically, the surface of the mask 22. The substrate to be processed 26 is tilted in conformity with the dimensional difference dy. One end of the substrate length lsy and one end of the mask length lmy are made to meet at the center 40 of the circular arc. At the other end of the substrate length lsy and the other end of the mask length lmy, the dimensional difference dy occurs. Next, a substrate angle θsy is calculated. With the center 40 of the circular arc as a center, and the substrate length lsy as a radius, a circular arc 39 is drawn. A straight line 41 passing through the other end of the mask length lmy and extending parallel to the particle incident direction is drawn. The circular arc 39 intersects the straight line 41 at the intersection 42. The angle between a plane on which the intersection 42 and the center 40 of the circular arc, and the plane with the straight line 41 as a perpendicular line, more specifically, the surface of the mask 22 is a substrate angle θsy. The substrate 26 is tilted by the calculated substrate angle θsy. This allows implantation of ions into a desired area. In the case where there is a dimensional difference dy between the substrate length lmy that is a circuit size of the substrate to be processed 26 and the mask length lsy that is a circuit size of the mask 22, and the dimensional difference dy<0, in other words, the mask 22 is smaller than the substrate to be processed 26, this dimensional difference dy can be corrected.

As described above, according to Example 4, a semiconductor device fabrication method capable of correcting the circuit pattern dimensional difference between the substrate to be processed and the stencil mask can be provided. Also according to Example 4, a semiconductor device fabrication apparatus capable of correcting the circuit pattern dimensional difference between the substrate to be processed and the stencil mask can be provided.

EXAMPLE 5

According to Example 5, the case of the dimensional differences dx and dy in two directions or the X and the Y direction is explained.

Figure 23:
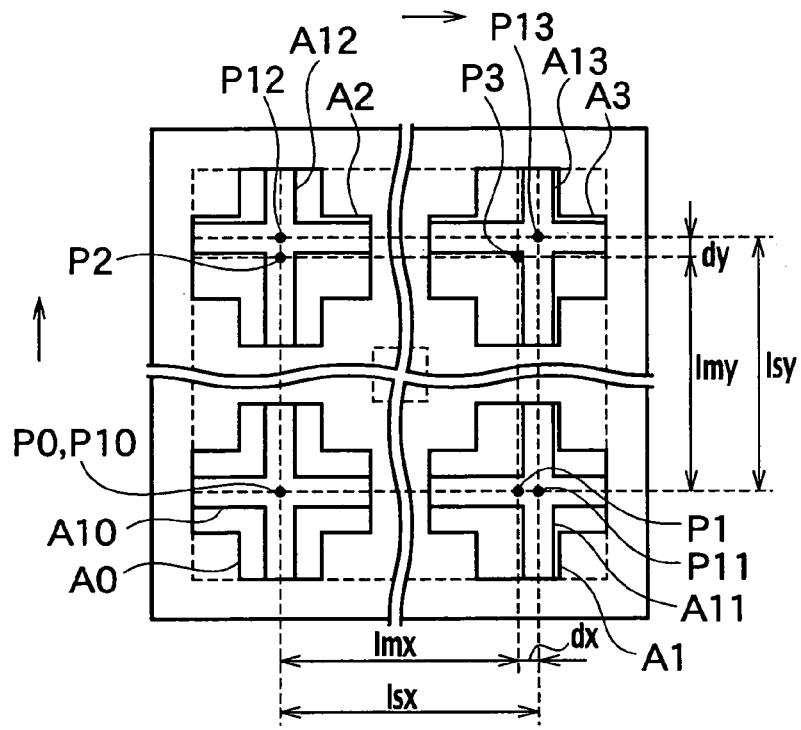
FIG. 23 shows an overlapping arrangement of a mask and a substrate to be processed in the case of dimensional difference dx<0 and dimensional difference dy<0 using a semiconductor device fabrication method according to Example 5.

According to Example 5, to begin with, as shown in FIG. 23, the case of dimensional difference dx<0 in the X direction and dimensional difference dy<0 in the Y direction is explained.

In FIG. 23, the mask 22 is overlapped with the substrate to be processed 26 when viewed along the particle incident direction 16 in the same way as in FIGS. 6 and 7. To begin with, the center P0 of the mark A0 on the mask is overlapped with the center P10 of the marks A10 on the substrate. However, the center P1 of the mark A1 on the mask does not overlap the center P11 of the mark A11 on the substrate, and the centers P1 and P11 are separated by the dimensional difference dx. The mask length lmx between the centers P0 and P1 is shorter than the substrate length lsx between the centers P10 and P11 by dimensional difference dx. The center P2 of the marks A2 on the mask does not overlap the center P12 of the mark A12 on the substrate, and the centers P2 and P12 are separated by the dimensional difference dy. The mask length lmy between the centers P0 and P2 is shorter than the substrate length lsy between the centers P10 and P12 by dimensional difference dy. At this time, the center P3 of the mark A3 on the mask does not overlap the center P13 of the mark A13 on the substrate, and the centers P3 and P13 are separated by the dimensional difference dx in the X direction, and by the dimensional difference dy in the Y direction.

Figure 18B:
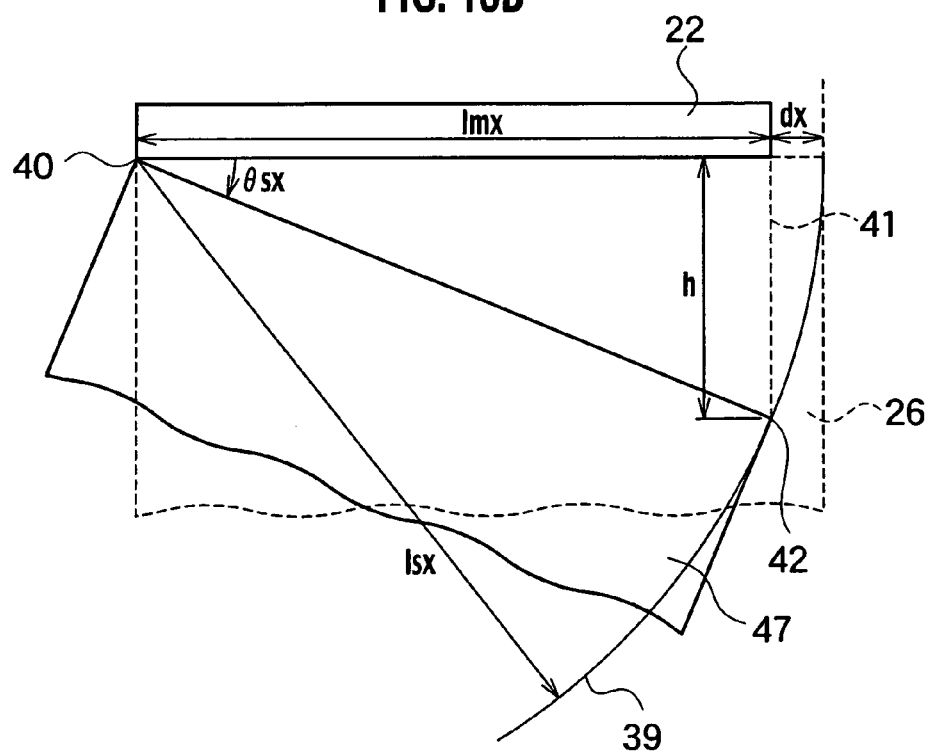
FIG. 18B shows an outline of a relationship among a mask length, a substrate length, a dimensional difference dx, and a substrate angle.

Therefore, in the case of dimensional difference dx<0 in the x direction and dimensional difference dy<0 in the y direction, the substrate angle is a composite of the substrate angle θsx in FIG. 18B according to Example 2 and the substrate angle θsy in FIG. 22B according to Example 4. This composite of the substrate angle θsx and the substrate angle θsy is possible because the substrate angle θsx and the substrate angle θsy are small enough for the composite of the substrate angle θsx and the substrate angle θsy.

Figure 24:
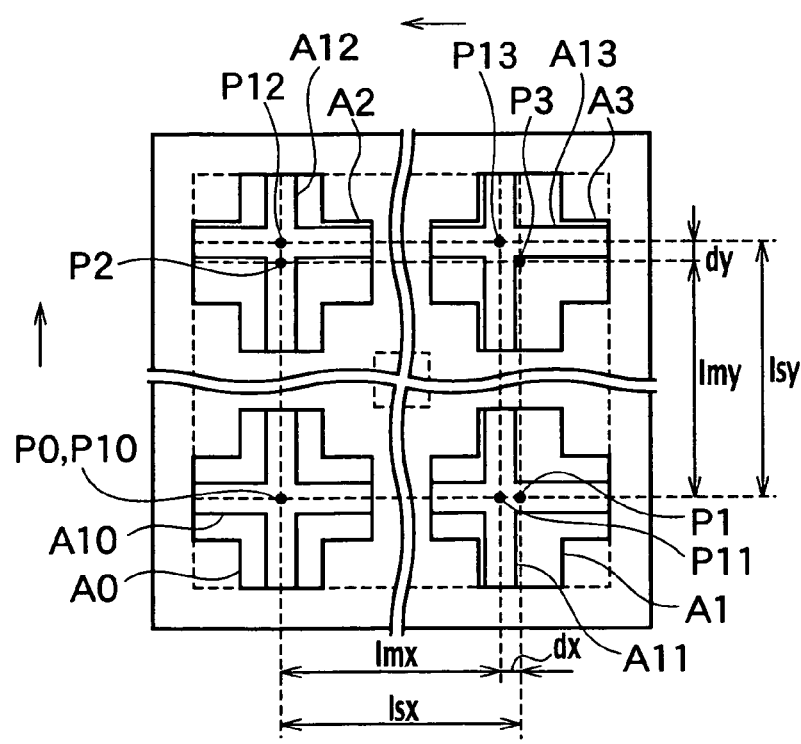
FIG. 24 shows an overlapping arrangement of a mask and a substrate to be processed in the case of dimensional difference dx>0 and dimensional difference dy<0 using the semiconductor device fabrication method according to Example 5.

In the case of the dimensional difference dx>0 in the x direction and the dimensional difference dy<0 in the y direction as shown in FIG. 24, the mask angle is the mask angle θmx in FIG. 9B according to Example 1, and the substrate angle is the substrate angle θsy in FIG. 22B according to Example 4. In other words, a composite of the mask angle θmx and the substrate angle θsy is provided.

Figure 25:
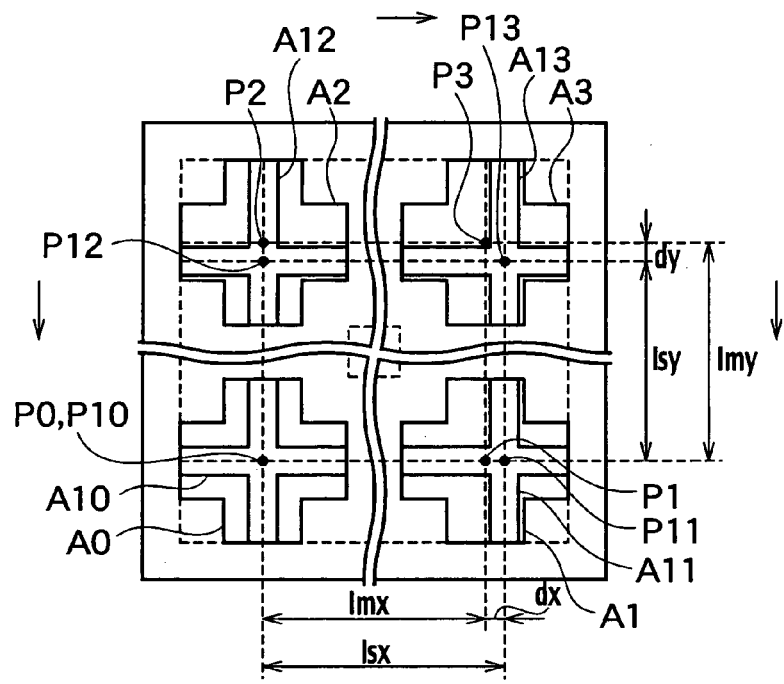
FIG. 25 shows an overlapping arrangement of a mask and a substrate to be processed in the case of dimensional difference dx<0 and dimensional difference dy>0 using the semiconductor device fabrication method according to Example 5.

Moreover, in the case of the dimensional difference dx<0 in the x direction and the dimensional difference dy>0 in the y direction as shown in FIG. 25, the mask angle is the mask angle θmy in FIG. 21B according to Example 3, and the substrate angle is the substrate angle θsx in FIG. 18B according to Example 2. In other words, a composite of the mask angle θmy and the substrate angle θsx is provided.

Figure 26:
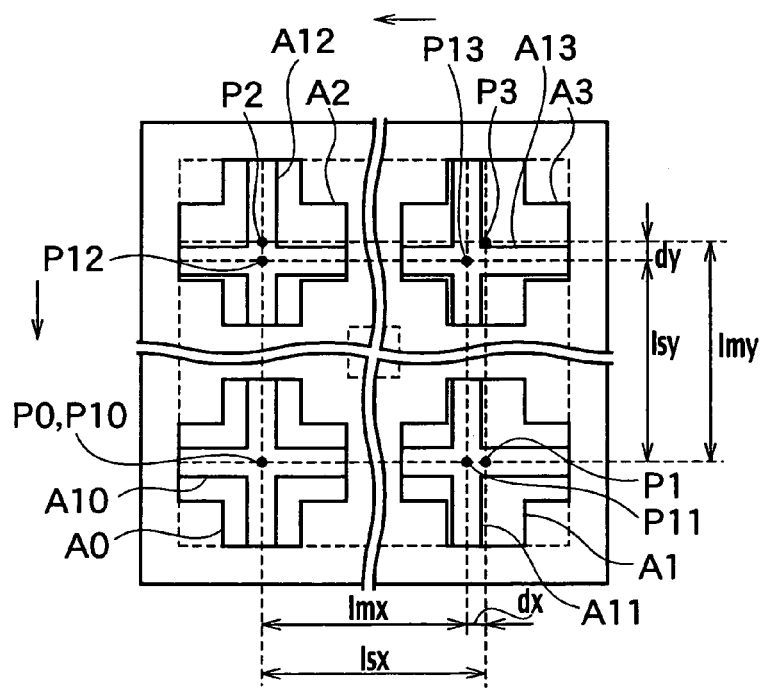
FIG. 26 shows an overlapping arrangement of a mask and a substrate to be processed in the case of dimensional difference dx>0 and dimensional difference dy>0 using the semiconductor device fabrication method according to Example 5.

Lastly, in the case of the dimensional difference dx>0 in the x direction and the dimensional difference dy>0 in the y direction as shown in FIG. 26, the mask angle is a composite of the mask angle θmx in FIG. 9B according to Example 1 and the mask angle θmy in FIG. 21B according to Example 3.

As described above, according to Example 5, a semiconductor device fabrication method capable of correcting the circuit pattern dimensional difference between the substrate to be processed and the stencil mask can be provided. Moreover, according to Example 5, a semiconductor device fabrication apparatus capable of correcting the dimensional difference in circuit pattern between the substrate to be processed and the stencil mask can be provided.

The present invention is not limited to Examples 1 through 5. In the examples, the marks A0 to A3 and A10 to A13 are used; however, the present invention is not limited to those marks, and may include a circuit pattern as long as the dimensional difference can be measured. In other words, part of the circuit pattern may be used as the marks A0 to A3 and A10 to A13. The substrate to be processed needs to have a semiconductor layer, and alternatively may be a substrate with a semiconductor layer on a semiconductor wafer or an insulator substrate such as a glass substrate.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. An apparatus for fabricating a semiconductor device which has a first circuit pattern of the semiconductor device including a first mark and a second mark, using a mask with at least part of a second circuit pattern of the semiconductor device including a third mark corresponding to the first mark and a fourth mark corresponding to the second mark, comprising:
    a particle direction collimating unit aligning the first mark with the third mark and the second mark with the fourth mark, and selectively irradiating the particles to the substrate using the mask; and
    an angle adjustment unit changing a relative angle between the substrate and the mask and in response to a dimensional difference between a first length from the first mark to the second mark and a second length from the third mark to the fourth mark so that the dimensional difference is canceled.

2. The apparatus of claim 1, wherein the angle adjustment unit comprises:
    a dimensional difference measurement unit measuring the dimensional difference; and
    an angle calculation unit calculating the relative angle based on the dimensional difference.

3. The apparatus of claim 2, wherein the angle adjustment unit further comprises a magnitude comparator that determines a magnitude relation of the first length and the second length, wherein the angle calculation unit calculates an angle of the mask when the second length is longer than the first length.

* * * * *